(12) United States Patent
Kim et al.

(10) Patent No.: US 8,946,722 B2
(45) Date of Patent: Feb. 3, 2015

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Seung-Hyun Kim, Gwangju (KR);
Byung-Chul Ahn, Seoul (KR);
Chang-Wook Han, Seoul (KR);
Hee-Suk Pang, Paju-si (KR);
Hong-Seok Choi, Seoul (KR);
Yoon-Heung Tak, Goyang-si (KR);
Mi-Young Han, Paju-si (KR);
Tae-Shick Kim, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/139,314

(22) Filed: Dec. 23, 2013

(65) Prior Publication Data

US 2014/0183499 A1 Jul. 3, 2014

(30) Foreign Application Priority Data

Dec. 31, 2012 (KR) .......................... 10-2012-0158109
Sep. 26, 2013 (KR) .......................... 10-2013-0114539

(51) Int. Cl.
*H01L 27/14* (2006.01)
*H01L 27/32* (2006.01)
*H01L 51/56* (2006.01)

(52) U.S. Cl.
CPC ............ *H01L 27/3213* (2013.01); *H01L 51/56* (2013.01)
USPC ................... 257/72; 257/40; 257/59; 257/69; 257/89; 257/98

(58) Field of Classification Search
CPC . H01L 27/32; H01L 27/3202; H01L 27/3204; H01L 27/3225; H01L 27/3258
See application file for complete search history.

(56) References Cited

U.S. PATENT DOCUMENTS 7,816,677 B2 * 10/2010 Lee et al. ......................... 257/40

* cited by examiner

*Primary Examiner* — Kyoung Lee
(74) *Attorney, Agent, or Firm* — Fenwick & West LLP

(57) ABSTRACT

An organic light emitting display device with enhanced luminous efficiency and color viewing angle and a method of manufacturing the same are disclosed. The method includes forming a first electrode of each of red, green, blue and white sub-pixels on a substrate, forming a white organic common layer on the first electrodes, and forming a second electrode on the white organic common layer, wherein the first electrodes each includes multiple transparent conductive layers and is formed such that a thickness of the first electrode of each of two sub-pixels among the red, green, blue and white sub-pixels is greater than a thickness of the first electrode of each of the other two sub-pixels, and at least two layers excluding the lowermost layer among the multiple transparent conductive layers of each first electrode are formed to cover opposite sides of the lowermost layer.

20 Claims, 22 Drawing Sheets

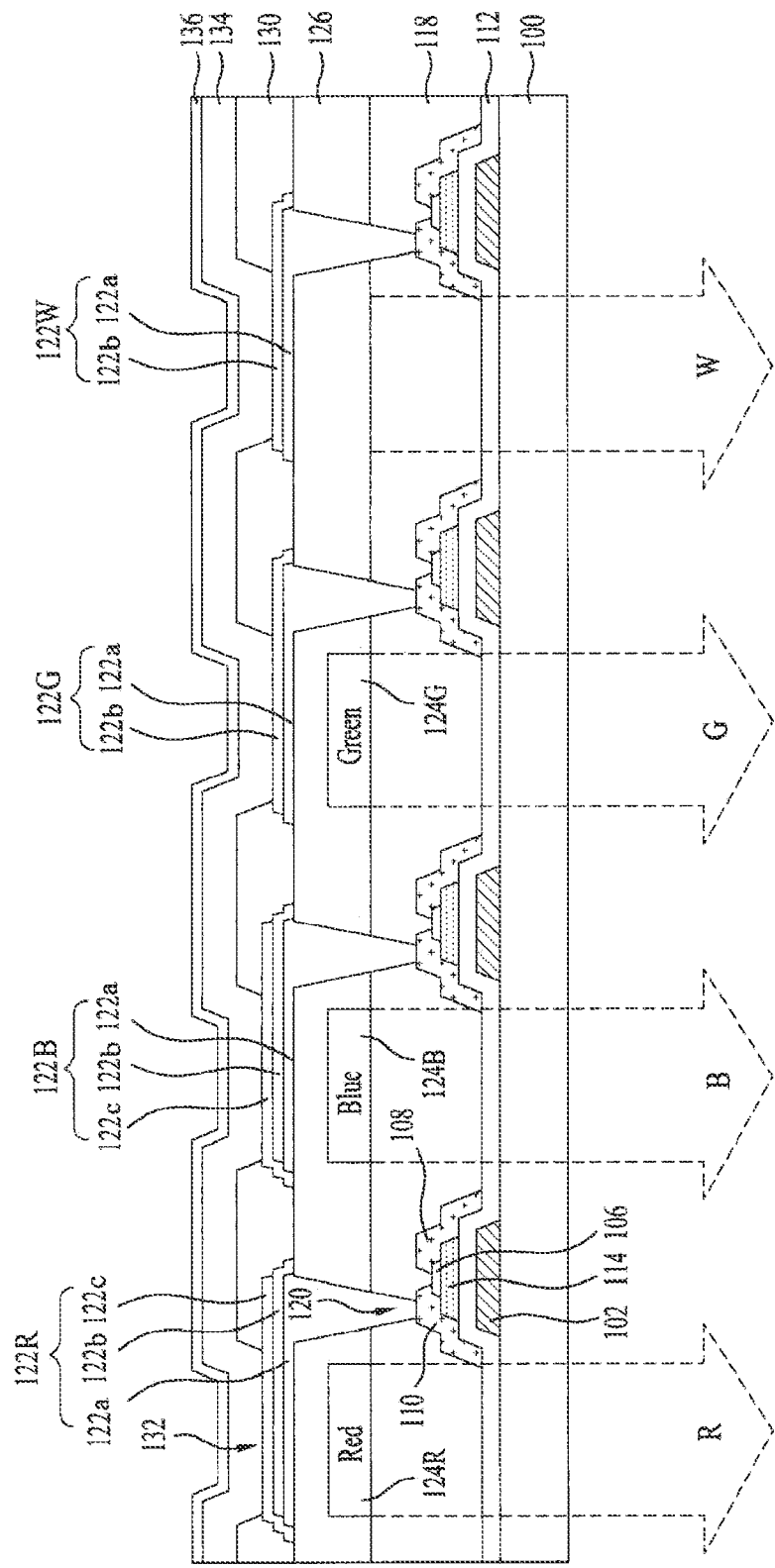

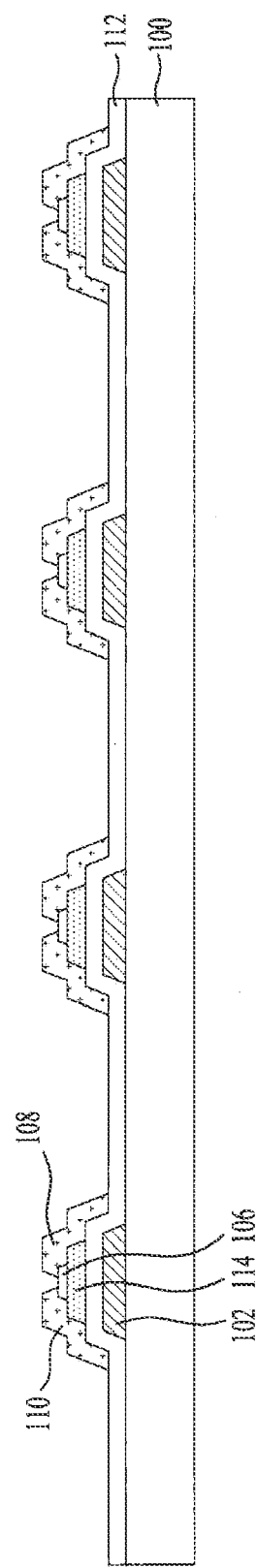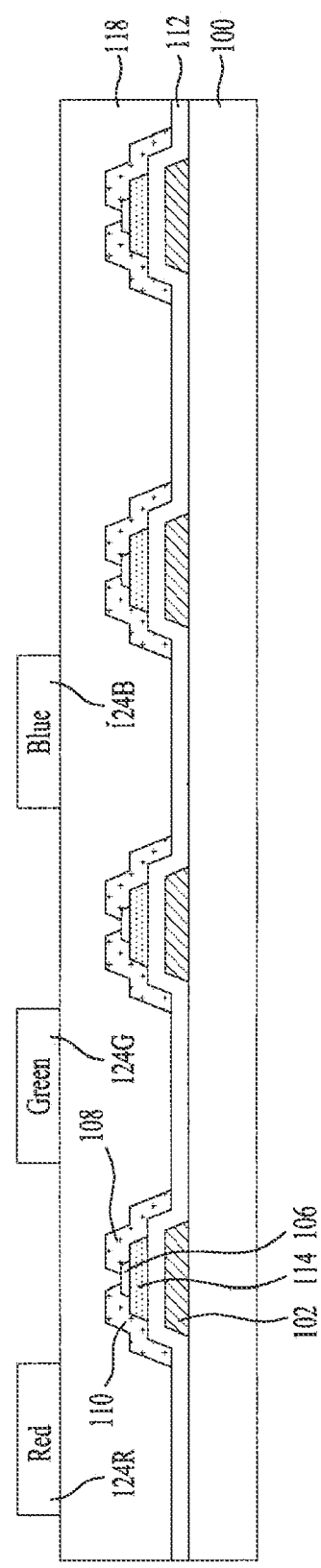

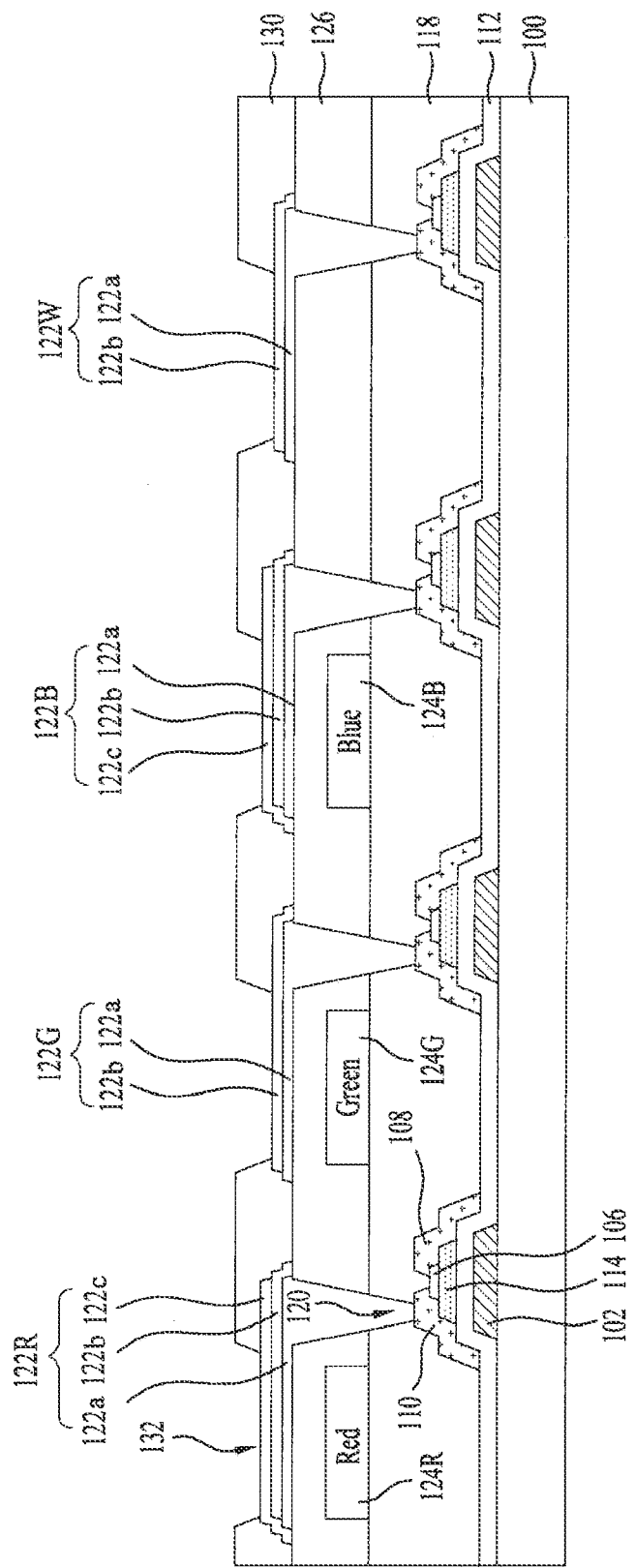

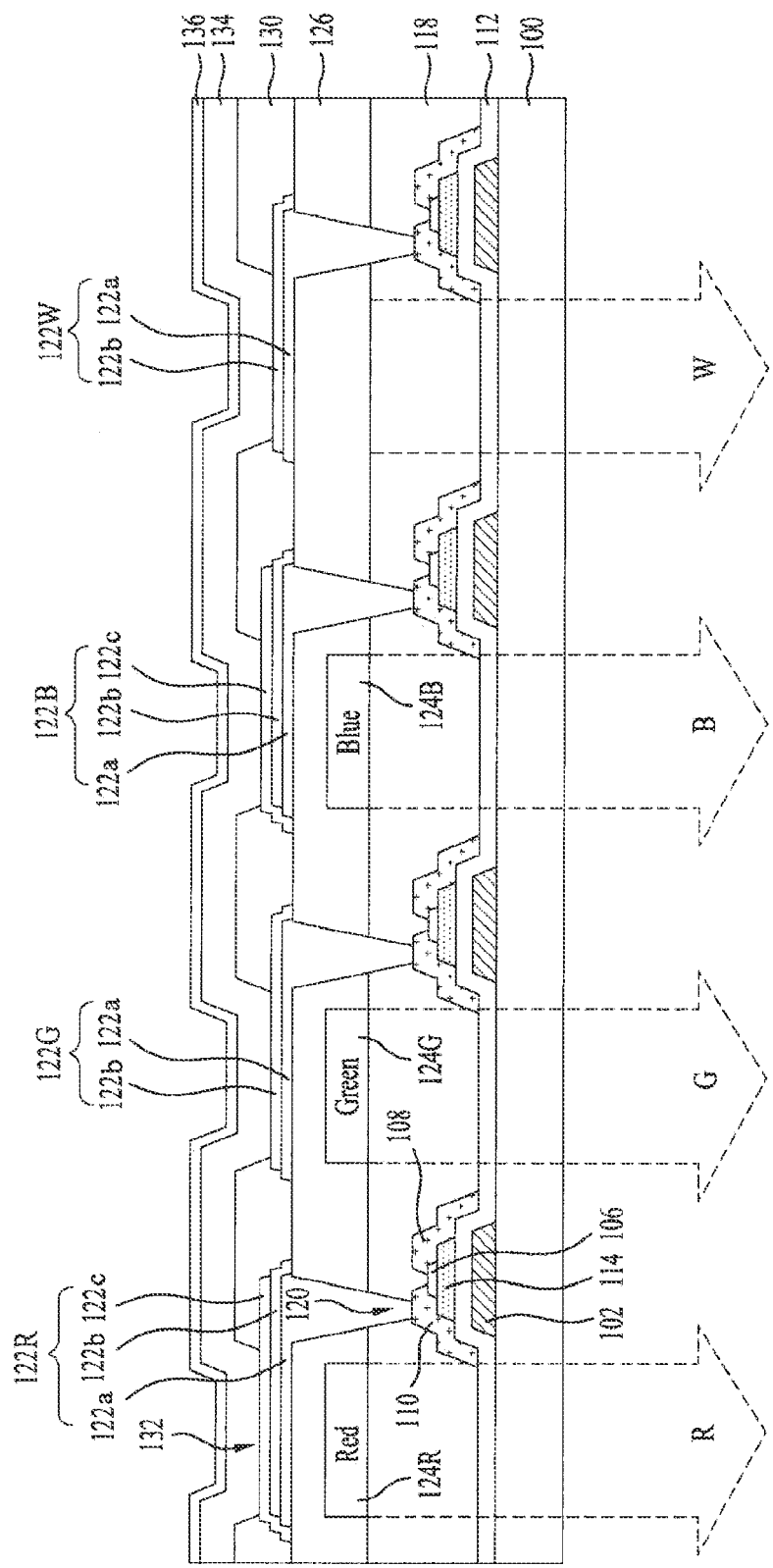

ORGANIC LIGHT EMITTING DISPLAY DEVICE AND METHOD OF MANUFACTURING THE SAME

CROSS-REFERENCE TO RELATED APPLICATIONS

This application claims the benefit of Korean Patent Applications No. 10-2012-0158109, filed on Dec. 31, 2012, and No. 10-2013-0114539, filed on Sep. 26, 2013, which are hereby incorporated by reference as if fully set forth herein.

BACKGROUND OF THE INVENTION

1. Field of the Invention

The present invention relates to an organic light emitting display device and a method of manufacturing the same, and more particularly, to an organic light emitting display device with enhanced luminous efficiency and color viewing angle and a method of manufacturing the same.

2. Discussion of the Related Art

Image display devices, which display a variety of information on a screen, are a core technology of information and communication and are becoming increasingly thinner, lighter, more portable, and higher in performance. Thus, organic light emitting diode (OLED) display devices, which display an image by controlling light emission of an organic emission layer (EML), have received attention as a flat panel display device that may address problems in terms of weight and volume associated with cathode ray tubes (CRTs).

In organic light emitting devices (OLEDs), basically, pixels consisting of red, green and blue sub-pixels are arranged in a matrix form, whereby an image is displayed. However, in white OLEDs (WOLEDs), which are one form of OLED, red, green and blue color filters are formed in a white organic light emitting cell to realize colors. However, a white organic light emitting cell realizes white color using the EML producing different colors and thus luminescence characteristics vary according to wavelengths, which results in deteriorated viewing angle and efficiency characteristics.

SUMMARY OF THE INVENTION

Accordingly, the present invention is directed to an organic light emitting display device and a method of manufacturing the same that substantially obviate one or more problems due to limitations and disadvantages of the related art.

An object of the present invention is to provide an organic light emitting display device with enhanced luminous efficiency and color viewing angle and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of manufacturing an organic light emitting display device includes forming a first electrode of each of red, green, blue and white sub-pixels on a substrate, forming a white organic common layer on the first electrodes; and forming a second electrode on the white organic common layer, wherein the first electrode includes multiple transparent conductive layers and is formed such that a thickness of the first electrode of each of two sub-pixels among the red, green, blue and white sub-pixels is greater than that of the first electrode of each of the other two sub-pixels, and at least two layers excluding the lowermost layer among the multiple transparent conductive layers of the first electrode are formed to cover opposite sides of the lowermost layer.

The thickness of the first electrode of each of the red and blue sub-pixels may be greater by about 300 Å to about 500 Å than that of the first electrode of each of the green and white sub-pixels.

The first electrode of the red sub-pixel may have the same thickness as that of the first electrode of the blue sub-pixel, and the first electrode of the green sub-pixel may have the same thickness as that of the first electrode of the white sub-pixel.

The first electrode of each of the red and blue sub-pixels may haves a thickness of 1100 Å to 1500 Å, and the first electrode of each of the green and white sub-pixels may have a thickness of 600 Å to 1200 Å.

The forming of the first electrode may include forming a first electrode including first, second and third transparent conductive layers in each of the red and blue sub-pixels and forming a first electrode including at least one of the first, second and third transparent conductive layers in each of the green and white sub-pixels.

The forming of the first electrode may include forming a first transparent conductive layer in each of the red, green, blue and white sub-pixels using photolithography and etching, forming a second transparent conductive layer covering a first side of the first transparent conductive layer in each of the red, green, blue and white sub-pixels using photolithography and etching, and forming a third transparent conductive layer covering a second side of each of the first and second transparent conductive layers in each of the red and blue sub-pixels using photolithography and etching.

In another aspect of the present invention, an organic light emitting display device includes first electrodes of each of red, green, blue and white sub-pixels formed on the substrate, a second electrode facing the first electrodes, and a white organic common layer formed between the first and second electrodes, wherein the first electrodes each include multiple transparent conductive layers and are formed such that a thickness of the first electrode of each of two sub-pixels among the red, green, blue and white sub-pixels is greater than a thickness of the first electrode of each of the other two sub-pixels, and at least two layers excluding the lowermost layer among the multiple transparent conductive layers of each first electrode are formed to cover opposite sides of the lowermost layer.

The red and blue sub-pixels, the first electrodes of which have the same thickness, may be arranged adjacent to each other, and the green and white sub-pixels, the first electrodes of which have the same thickness, may be arranged adjacent to each other.

The white organic common layer may include at least two light emitting units formed between the first and second electrodes and at least one charge generation layer formed between the at least two light emitting units.

The white organic common layer may include a first light emitting unit formed on the first electrode and including a first emission layer to realize blue color, a first charge generation layer formed on the first light emitting unit, and a second light emitting unit formed on the first charge generation layer and including a second emission layer to realize yellow-green color.

The white organic common layer may further include a second charge generation layer formed on the second light emitting unit and a third light emitting unit formed on the second charge generation layer and including a third emission layer to realize blue color.

The white organic common layer may further include a second charge generation layer formed on the second light emitting unit and a third light emitting unit formed on the second charge generation layer and including a third emission layer to realize red color and a fourth emission layer to realize blue color.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 5 is a view illustrating another arrangement example of red, green, blue and white sub-pixels illustrated in FIG. 1;

FIGS. 7A to 7F are sectional views illustrating a method of manufacturing the organic light emitting display panel of FIG. 2;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
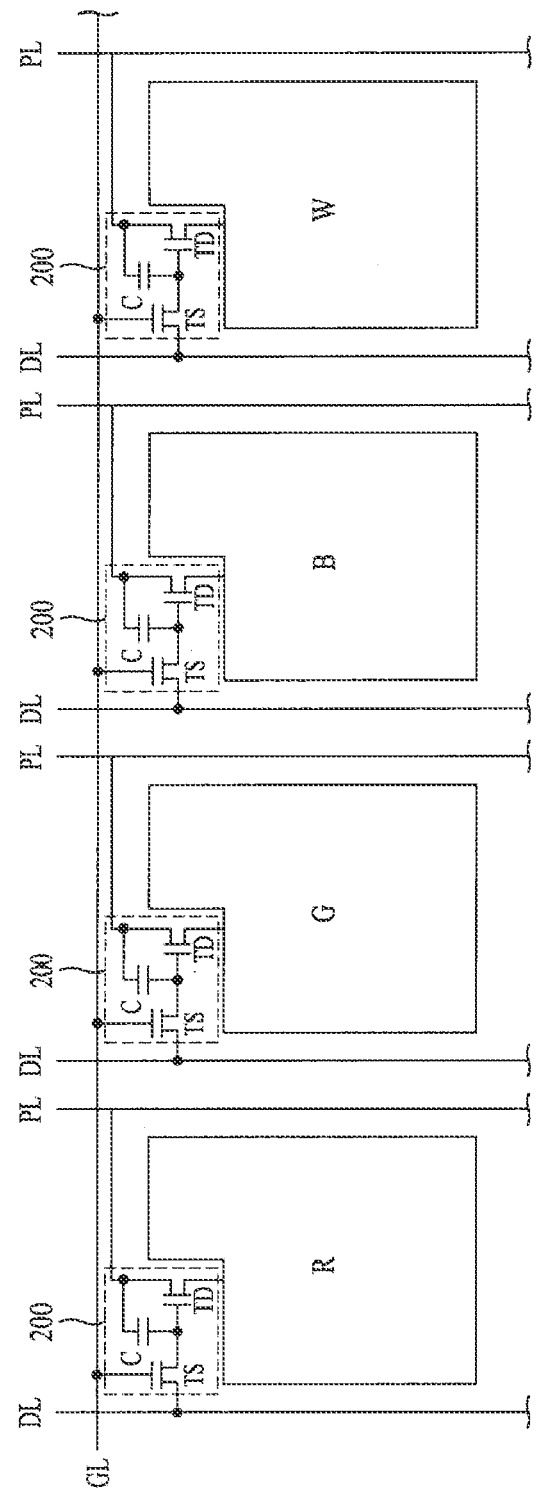
FIG. 1 is a plan view of an organic light emitting display panel according to a first embodiment of the present invention.
Figure 2:
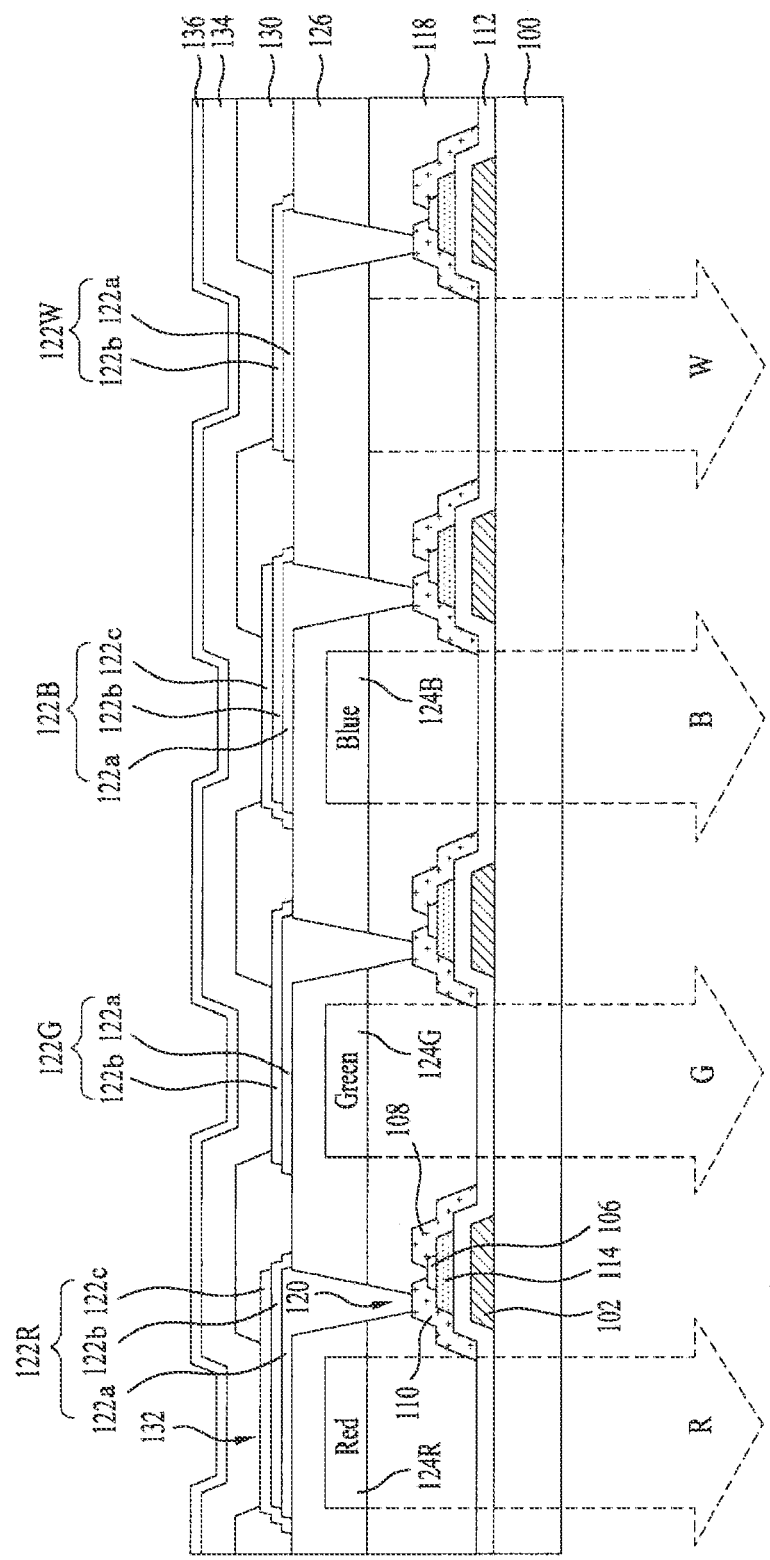
FIG. 2 is a sectional view of the organic light emitting display panel of FIG. 1.

FIG. 1 is an equivalent circuit diagram of R, G and B sub-pixel regions according to the present invention. FIG. 2 is a sectional view of an organic light emitting display panel according to R, G and B sub-pixel regions illustrated in FIG. 1.

Referring to FIGS. 1 and 2, the organic light emitting display panel according to the embodiment of the present invention includes a plurality of sub-pixel regions defined by intersections of gate lines GLs, data lines DLs, and power lines PLs.

The sub-pixel regions include R sub-pixel regions, G sub-pixel regions, B sub-pixel regions, and W sub-pixel regions, and the R, G, B and W sub-pixel regions are arranged in a matrix form to display an image.

Each of the R, G, B and W sub-pixel regions includes a cell driving unit 200 and an organic light emitting cell connected to the cell driving unit 200.

The cell driving unit 200 includes a switch thin film transistor TS connected to the gate line GL and the data line DL, a driving thin film transistor TD connected to the switch thin film transistor TS and between the power line PL and a first electrode 122 of an organic light emitting device (OLED), and a storage capacitor C connected between the power line PL and a drain electrode 110 of the switch thin film transistor TS.

The switch thin film transistor TS includes a gate electrode connected to the corresponding gate line GL, a source electrode connected to the corresponding data line DL, and the drain electrode 110 connected to a gate electrode of the driving thin film transistor TD and the storage capacitor C. The driving thin film transistor TD includes a source electrode connected to the corresponding power line PL and the drain electrode 110 connected to the first electrode 122. The storage capacitor C is connected between the corresponding power line PL and the gate electrode of the driving thin film transistor TD.

When a scan pulse is supplied to the gate line GL, the switch thin film transistor TS is turned on and thus a data signal supplied to the data line DL is supplied to the storage capacitor C and the gate electrode of the driving thin film transistor TD. The driving thin film transistor TD controls current I supplied from the power line PL to the OLED in response to the data signal supplied to the gate electrode, thereby adjusting light emission of the OLED. In addition, even if the switch thin film transistor TS is turned off, the driving thin film transistor TD supplies constant current I until a data signal of the next frame is supplied, due to voltage charged in the storage capacitor C, whereby the OLED maintains light emission.

As illustrated in FIG. 2, the driving thin film transistor TD is connected to the gate line GL and includes a gate electrode 102 formed on a substrate 100, a gate insulating film 112 formed on the gate electrode 102, an oxide semiconductor layer 114 formed to correspond to the gate electrode 102, with the gate insulating film 112 disposed therebetween, an etch stopper 106 formed on the oxide semiconductor layer 114 to prevent damage to the oxide semiconductor layer 114 and protect the oxide semiconductor layer 114 from oxygen, a source electrode 108 connected to the data line DL, and the drain electrode 110 facing the source electrode 108. In addition, an organic protection film 118 formed of an organic insulating material is formed on the driving thin film transistor TD to planarize the substrate 100 provided with the driving thin film transistor TD. In another embodiment, the organic protection film 118 on the driving thin film transistor TD may be formed as two layers including an inorganic protection film formed of an inorganic insulating material and an organic protection film formed of an organic insulating material. The oxide semiconductor layer 114 is formed of an oxide including at least one metal selected from among Zn, Cd, Ga, In, Sn, Hf, and Zr. A thin film transistor including the oxide semiconductor layer 114 has higher charge mobility and lower leakage current than a thin film transistor including a silicon semiconductor layer. In addition, the thin film transistor including a silicon semiconductor layer is manufactured through a high-temperature manufacturing process and needs to be subjected to a crystallization process, and thus, as the thin film transistor is fabricated to a large area, uniformity is deteriorated during the manufacturing process, which makes it difficult to fabricate a large-area thin film transistor. By contrast, the thin film transistor including the oxide semiconductor layer 114 may be manufactured through a low-temperature manufacturing process and is advantageously suited to large-area fabrication.

As a color filter, an R color filter 124R is formed on the organic protection film 118 of the R sub-pixel region to realize red (R) color, a G color filter 124G is formed on the organic protection film 118 of the G sub-pixel region to realize green (G) color, a B color filter 124B is formed on the organic protection film 118 of the B sub-pixel region to realize blue (B) color, and no color filter is formed on the organic protection film 118 of the W sub-pixel region and thus the W sub-pixel region realizes white (W) color.

The organic light emitting cell includes the first electrode 122 connected to the drain electrode 110 of the driving thin film transistor TD, a bank insulating film 130 provided with bank holes 132 to expose the first electrode 122, an organic common layer 134 on the first electrode 122, and a second electrode 136 formed on the organic common layer 134.

Figure 3:
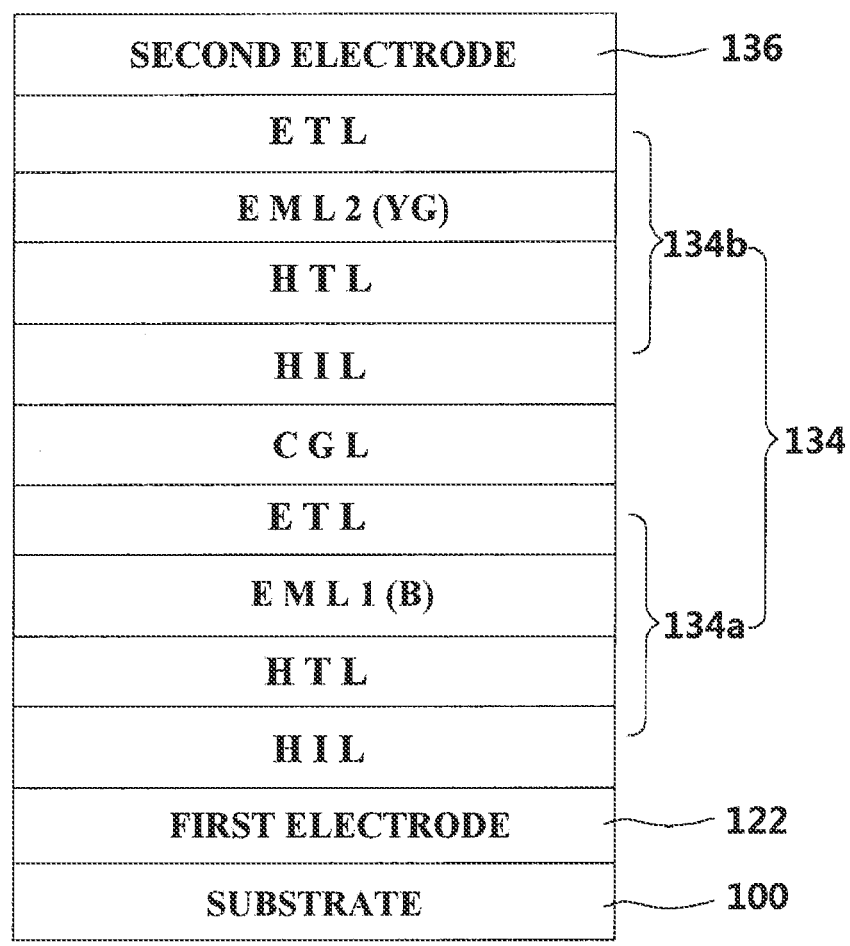
FIG. 3 is a sectional view illustrating an organic common layer illustrated in FIG. 2.

As illustrated in FIG. 3, the organic common layer 134 includes a charge generating layer CGL and first and second light emitting units 134a and 134b provided with the CGL disposed therebetween. Each of the first and second light emitting units 134a and 134b includes a hole injection layer (HIL), a hole transport layer (HTL), an emission layer (EML), and an electron transport layer (ETL). In particular, a first EML EML1 of the first light emitting unit 134a includes a fluorescent blue dopant and host to emit blue light, and a second EML EML2 of the second light emitting unit 134b includes a phosphorescent yellow-green dopant and host to emit yellow-green light. Accordingly, the organic common layer 134 may realize white color through mixing of the blue light of the first light emitting unit 134a and the yellow-green light of the second light emitting unit 134b. In addition, the organic common layer 134 may realize white light using different fluorescent and phosphorescent dopants.

The first electrode 122 as an anode is formed to different thicknesses according to R, G, B and W sub-pixels. That is, first electrodes 122G and 122W of the respective G and W sub-pixels determining viewing angle are formed to a first thickness, and first electrodes 122R and 122B of the respective R and B sub-pixels determining luminous efficiency is formed to a second thickness greater by about 300 Å to about 500 Å than the first thickness. For example, the first electrodes 122G and 122W of the respective G and W sub-pixels have a thickness of 600 Å to 1200 Å, and the first electrodes 122R and 122B of the respective R and B sub-pixels have a thickness of 1100 Å to 1500 Å.

The first electrode 122 is formed as a single layer or multiple layers using a transparent conductive material such as indium tin oxide (ITO), indium zinc oxide (IZO), or IGZO. In a case in which the first electrode 122 is formed as two layers formed of ITO and IZO, when the layer of ITO has a greater thickness than that of the layer of IZO, intensity of yellow-green light decreases and therefore the layer of IZO may be thicker than the layer of ITO. In particular, as shown in Table 1 below, an example according to the present invention in which the first electrode 122 is formed as two layers formed of ITO/IZO or IZO/ITO and has a thickness of 1200 Å to 1300 Å has maximum efficiency of yellow-green light and thus has reduced efficiency of blue light and, accordingly, has wider color viewing angle than that of comparative example 1 in which a first electrode has a thickness of 500 Å and is formed of ITO.

TABLE 1

| Conditions of first electrode | Color viewing angle |
| --- | --- |
| Comparative Example (ITO, 500 Å) | 0.053 |
| Example (two layers of ITO and IZO (1200 Å) | 0.010 |
| Example (two layers of ITO and IZO (1300 Å) | 0.015 |

Similarly, when the first electrode 122 is formed as a single layer formed of a mixture of ITO and IZO, the amount of IZO may be greater than that of ITO.

Each of the first electrodes 122R and 122B of the respective R and B sub-pixels includes first, second and third transparent conductive layers 122a, 122b and 122c stacked one upon another, and each of the first electrodes 122G and 122W of the respective G and W sub-pixels includes at least one of the first, second and third transparent conductive layers 122a, 122b and 122c. A case in which the first and second transparent conductive layers 122a and 122b are stacked as each of the first electrodes 122G and 122W of the respective G and W sub-pixels will be described below with reference to FIG. 2 by way of example.

Figure 4A:
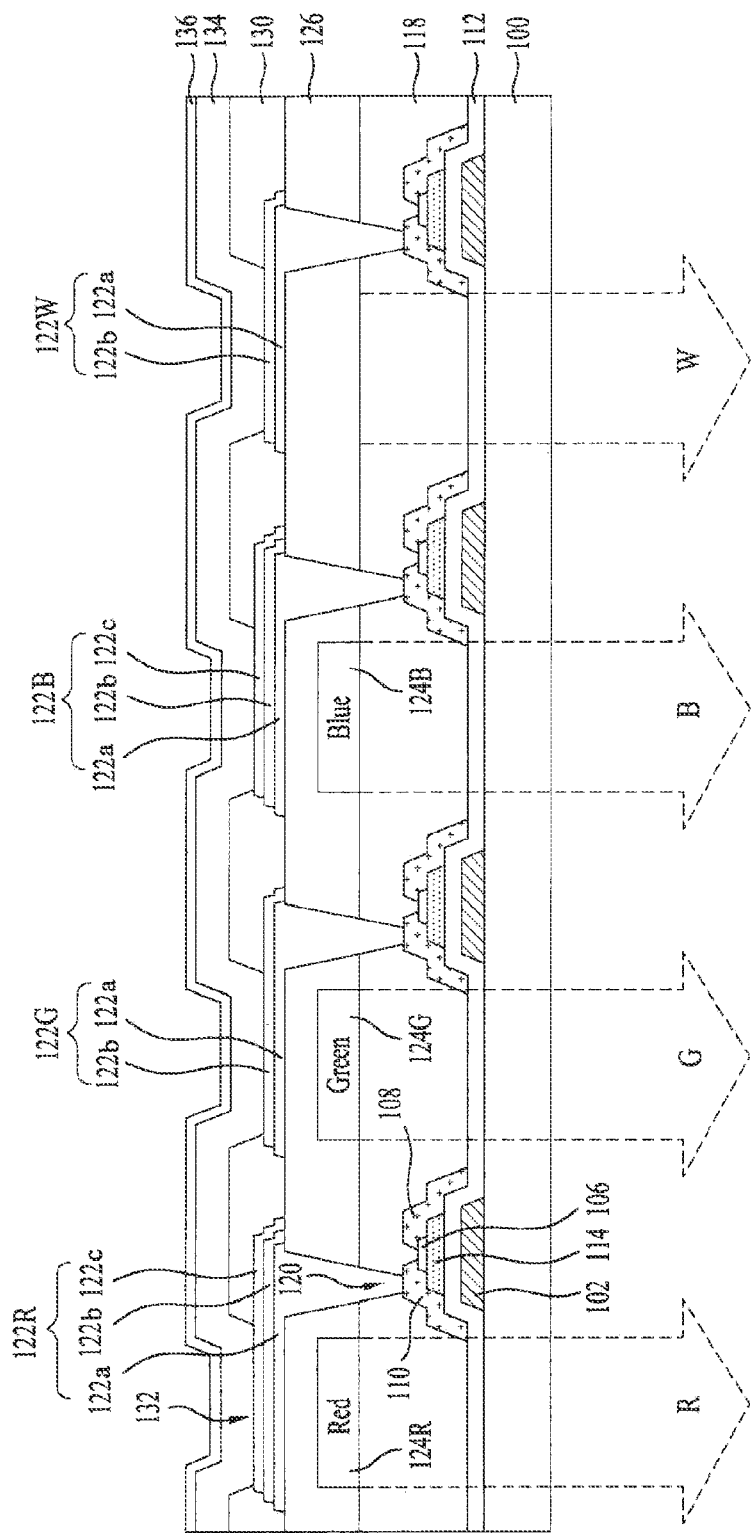
FIGS. 4A and 4B are sectional views illustrating another example of a first electrode illustrated in FIG. 2.
Figure 4B:
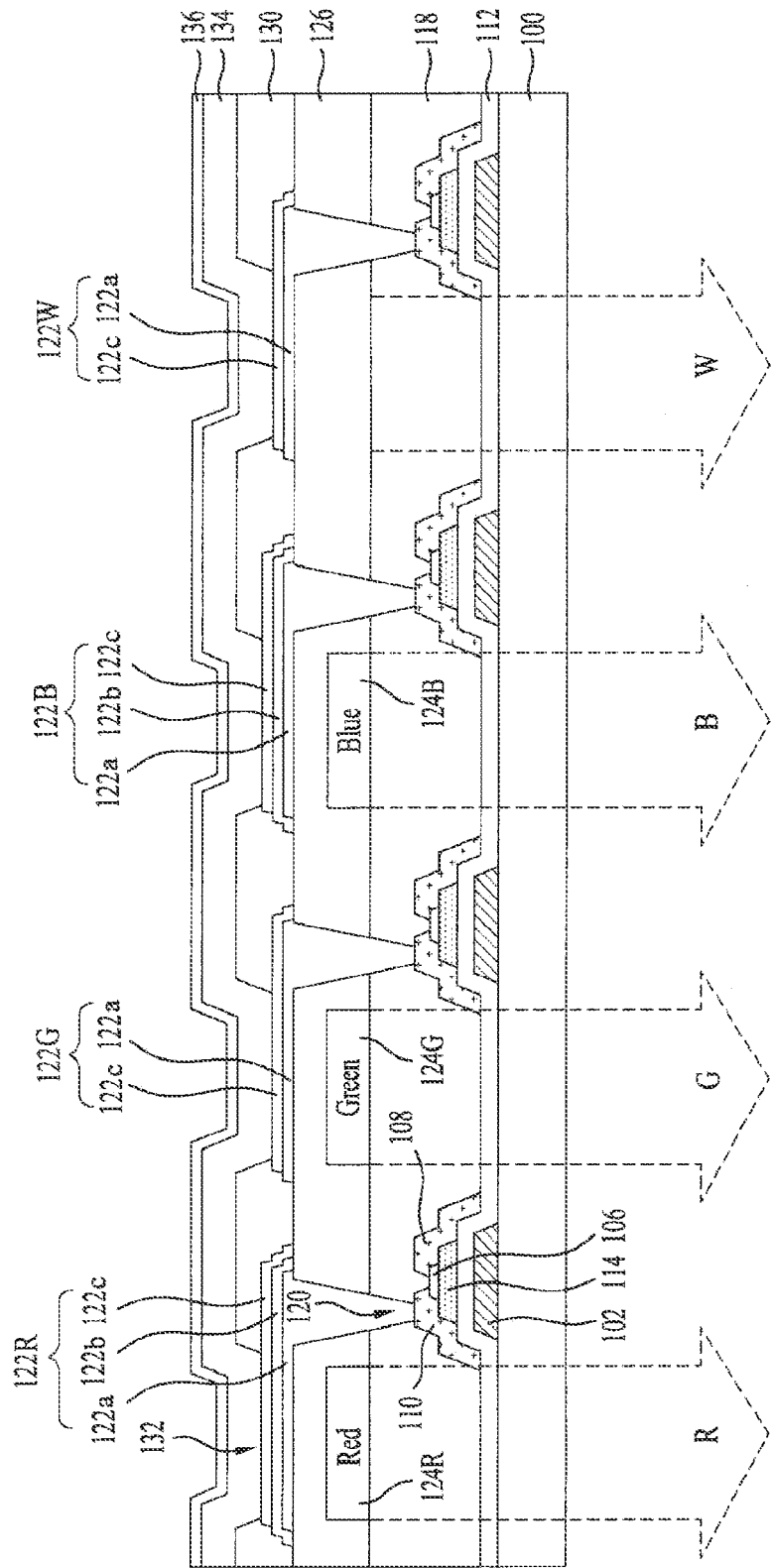

The first, second and third transparent conductive layers 122a, 122b and 122c of each of the first electrodes 122R and 122B of the respective R and B sub-pixels are stacked as illustrated in FIG. 2, 4A or 4B.

Referring to FIG. 2, the second transparent conductive layer 122b is formed so as to cover a first side of the first transparent conductive layer 122a, and the third transparent conductive layer 122c is formed so as to cover a second side of each of the first and second transparent conductive layers 122a and 122b.

Referring to FIG. 4A, the second transparent conductive layer 122b is formed so as to cover a first side of the first transparent conductive layer 122a, and the third transparent conductive layer 122c is formed so as to cover a first side of second transparent conductive layer and 122b.

Referring to FIG. 4B, the second transparent conductive layer 122b is formed so as to cover opposite sides of the first transparent conductive layer 122a, and the third transparent conductive layer 122c is formed so as to cover a first side of each of the first and second transparent conductive layers 122a and 122b. In this case, each of the first electrodes 122G and 122W of the respective G and W sub-pixels may have a structure in which the first and third transparent conductive layers 122a and 122c are stacked.

In addition, the first electrodes 122R and 122B of the respective R and B sub-pixels may have various other structures.

As such, multiple transparent conductive layers constituting the first electrode 122 of each of the R, G, B and W sub-pixels have a step structure and thus step coverage of an overcoat layer 126 formed so as to cover opposite sides of the first electrode 122 is enhanced.

In addition, a microcavity length of the R and B sub-pixels is greater than that of the G and W sub-pixels by a difference in thickness between the first electrodes 122. Accordingly, intensity of white light emitted via the first electrodes 122R and 122B of the respective R and B sub-pixel regions increases and thus luminous efficiency is enhanced. In particular, in the R and B sub-pixels, a total thickness from a lower surface of each of the first electrodes 122R and 122B to an upper surface of the organic common layer 134 is formed so as to satisfy resonance conditions shown in Equation 1 below.

$$\frac{n^a d^a}{\lambda_y} = \sum_j \frac{n_j^w d_j^w}{\lambda_y} = 1.72 \sim 2.12 \qquad \text{[Equation 1]}$$

In Equation 1, $\lambda_y$ denotes a peak wavelength of yellow-green light, $d^a$ denotes a thickness of the first electrode 122, $d^w$ denotes a total thickness of the organic common layer 134, $n^w$ denotes an index of refraction of the organic common layer 134, and $n^a$ denotes an index of refraction of the first electrode 122. In this regard, a sum of the thicknesses of the first electrodes 122R and 122B of the respective R and B sub-pixels and the thickness of the organic common layer 134 may be between about 2500 and 5000 Å. To satisfy conditions of the sum, as the thicknesses of the first electrodes 122R and 122B increase, the thickness of the organic common layer 134 has to be decreased and a thickness variation ratio is 1:1 or greater. When the thickness of the first electrode 122 is formed to a thickness of up to 1500 Å, the thickness of the organic common layer 134 may be reduced, which results in reduced raw material cost, and a distance between the first and second electrodes 122 and 136 decreases and thus driving voltage may be reduced.

The second electrode 136 as a cathode is formed of a reflective metal material such as aluminum (Al). As illustrated in FIG. 2, an organic light emitting display device may be of a bottom emission type, but embodiments are not limited thereto. That is, the organic light emitting display device may be of a bottom emission type, a top emission type, or a dual emission type according to materials of the first and second electrodes 122 and 136.

In the organic light emitting cell, when a voltage is applied between the first electrode 122 and the second electrode 136, holes injected from the first electrode 122 and electrons injected from the second electrode 136 are recombined, forming excitons and, when the excitons drop to a ground state, light is emitted in a bottom direction of the organic light emitting display device.

Meanwhile, in FIG. 2, the R, G, B and W sub-pixels are arranged in descending order. In another embodiment, however, the sub-pixels including the first electrodes 122 having the same thickness may be arranged adjacent to each other. That is, as illustrated in FIG. 5, R, B, G and W sub-pixels are arranged in this descending order.

Figure 6A:
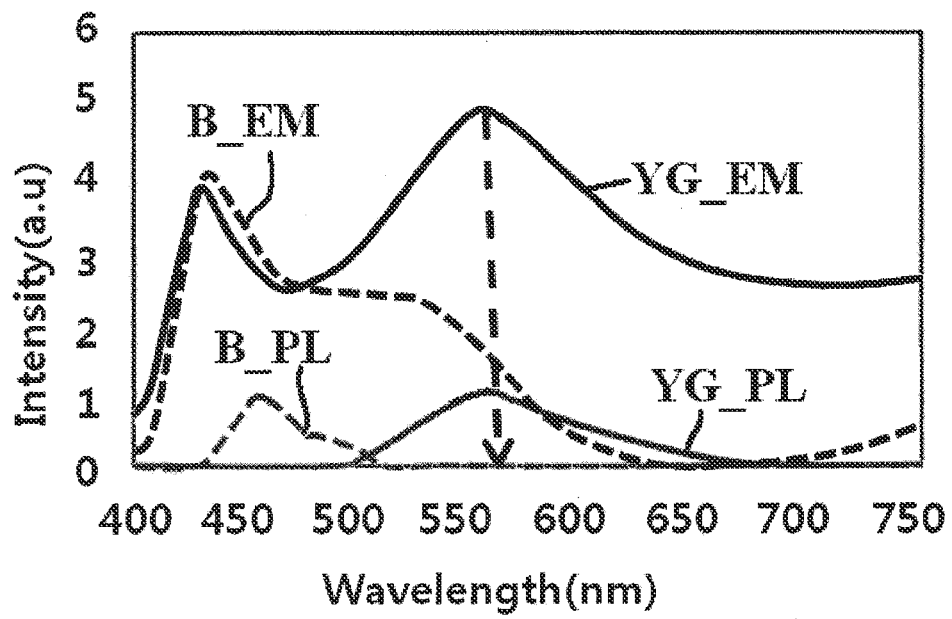
FIGS. 6A to 6C are graphs showing luminescence spectra of comparative examples 1 and 2 and example 1.
Figure 6B:
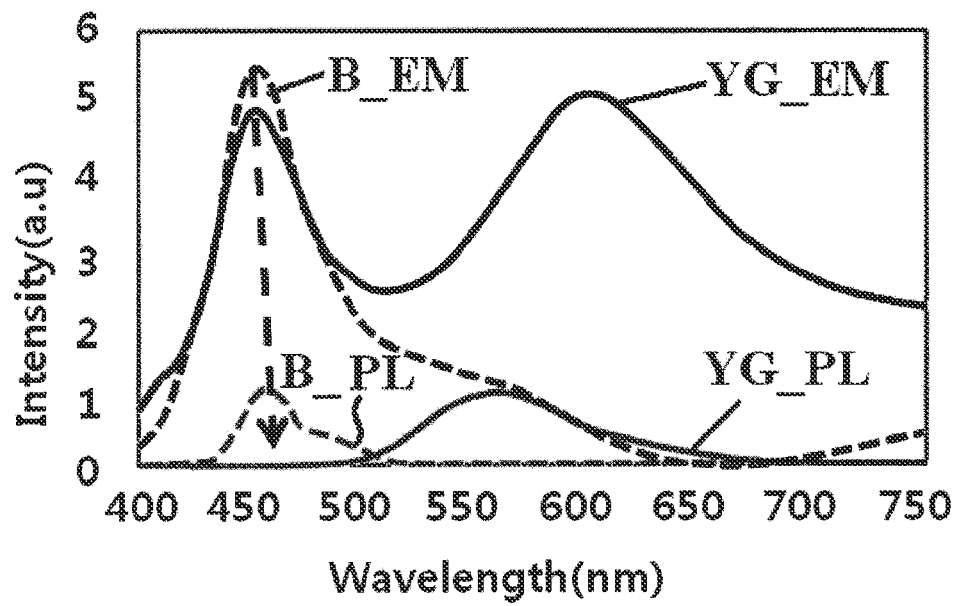
Figure 6C:
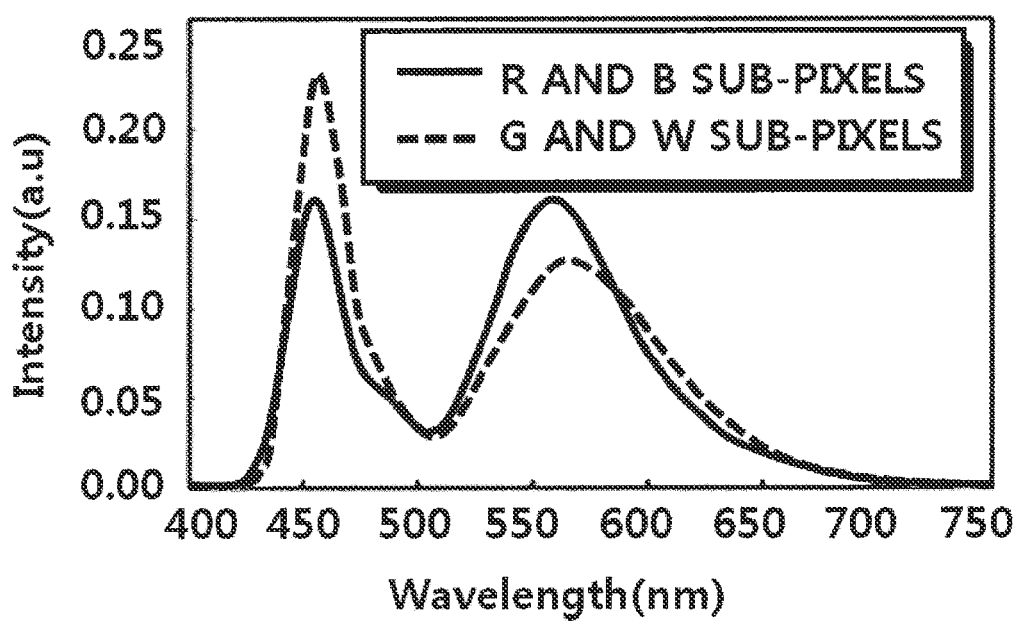

FIGS. 6A to 6C are graphs showing luminescence spectra of various examples according to thickness of the first electrode 122. In FIGS. 6A to 6C, a photoluminescence (PL) peak denotes a peak of light emitted from each EML, an emittance (EM) peak denotes a peak of light that varies according to thickness and optical characteristic of each layer constituting the organic common layer 134 between the first and second electrodes 122 and 136, and an electroluminescence (EL) peak denotes a peak obtained by multiplying the PL peak by the EM peak.

In addition, in FIGS. 6A to 6C and Table 2 below, comparative example 1 represents an organic light emitting display device in which a first electrode of each of the R, G, B and W sub-pixel regions is formed to a first thickness, comparative example 2 represents an organic light emitting display device in which a first electrode of each of the R, G, B and W sub-pixel regions is formed to a second thickness that is greater than the first thickness, and example 1 represents an organic light emitting display device in which the first electrode 122 of each of the R and B sub-pixel regions is formed to the second thickness and the first electrode 122 of each of the G and W sub-pixel regions is formed to the first thickness. As illustrated in FIG. 3, each of the organic light emitting display devices of comparative examples 1 and 2 and example 1 includes the first light emitting unit 134a to emit blue light and the second light emitting unit 134b to emit yellow-green light.

TABLE 2

| | Efficiency of electroluminescence peak (Cd/A) | | | | Color viewing angle | Panel efficiency |
|---|---|---|---|---|---|---|
| | R | G | B | W | (Δu'v') | (cd/A) |
| Comparative Example 1 | 6.0 | 18.8 | 2.2 | 63.6 | 0.016 | 23.9 |
| Comparative Example 2 | 5.0 | 14.3 | 2.6 | 55.3 | 0.057 | 27.5 |
| Example | 6.0 | 18.8 | 2.6 | 63.6 | 0.016 | 27.0 |

The organic light emitting display device of comparative example 1 illustrated in FIG. 6A has wider full width at half maximum (FWHM) of the EM peak wavelength of yellow-green light and wider FWHM of the EM peak wavelength of blue light than an FWHM of the EM peak wavelength of yellow-green light and an FWHM of the EM peak wavelength of blue light, respectively, of the organic light emitting display device of comparative example 2 illustrated in FIG. 6B. From the results, it can be confirmed that the organic light emitting display device of comparative example 2 including the first electrode having a second thickness has narrower color viewing angle than that of the organic light emitting display device of comparative example 1 including the first electrode having a first thickness, as shown in Table 2.

In addition, an intensity of the EM peak of each of blue light and yellow-green light of comparative example 1 illustrated in FIG. 6A is lower than that of the EM peak of each of blue light and yellow-green light of comparative example 2 illustrated in FIG. 6B. From the results, it can be confirmed that the organic light emitting display device of comparative example 1 including the first electrode having a first thickness has deteriorated panel efficiency characteristics when compared to the organic light emitting display device of comparative example 2 including the first electrode having a second thickness, as shown in Table 2. In particular, as shown in Table 1, it can be confirmed that the R and B sub-pixels of comparative example 1, each of which includes the first electrode having a first thickness, have a lower efficiency than that of the R and B sub-pixels of comparative example 2 including the first electrode having a second thickness.

By contrast, in Example 1, as illustrated in FIG. 6C, EM peak wavelength of white light emitted from the G and W sub-pixel regions respectively including the first electrodes 122G and 122W having a first thickness has a similar phase to that of EM peak wavelength of white light emitted from the R and B sub-pixel regions respectively including the first electrodes 122R and 122B having a second thickness. Accordingly, the organic light emitting display device of Example 1 may have enhanced panel efficiency when compared to the organic light emitting display devices of comparative examples 1 and 2 and the same color viewing angle characteristic as that of the organic light emitting display device of comparative example 1.

FIGS. 7A to 7F are sectional views illustrating a method of manufacturing the organic light emitting display panel of FIG. 2.

Referring to FIG. 7A, a driving thin film transistor including the gate electrode 106, the gate insulating film 112, a semiconductor pattern 115, the source electrode 108, and the drain electrode 110 is formed on the substrate 100.

In particular, a gate metal layer is formed on the substrate 100 through deposition such as sputtering or the like. The gate metal layer is formed of a metal material such as Mo, Ti, Cu, AlNd, Al, Cr, an Mo alloy, a Cu alloy, an Al alloy, an Mo—Ti alloy, or the like. Subsequently, the gate metal layer is patterned by photolithography and etching to form the gate electrode 102.

Subsequently, the gate insulating film 112 is formed over an entire upper surface of the substrate 100 with the gate electrode 102 formed thereon using an inorganic insulating material such as silicon oxide ($SiO_x$), silicon nitride ($SiN_x$), or the like. Thereafter, the oxide semiconductor layer 114 and the etch stopper 106 are sequentially formed on the substrate 100 with the gate insulating film 112 formed thereon by photolithography and etching.

Subsequently, a data metal layer is formed on the substrate 100 having semiconductor patterns through deposition such as sputtering or the like. The data metal layer is formed of titanium (Ti), tungsten (W), an Al-based metal, molybdenum (Mo), copper (Cu), or the like. Thereafter, the data metal layer is patterned by photolithography and etching to form the source and drain electrodes 108 and 110.

Referring to FIG. 7B, the organic protection film 118 is formed on the substrate 100 with the source and drain electrodes 108 and 110 formed thereon, and R, G and B color filters 124R, 124G and 124B are formed in the corresponding sub-pixel regions.

In particular, the organic protection film 118 is formed over an entire upper surface of the substrate 100 with the source and drain electrodes 108 and 110 formed thereon, using an organic insulating material such as an acryl-based resin. Thereafter, the red color filter 124R is formed on the organic protection film 118 in the R sub-pixel region by coating a red color resist colored with red (R) thereon and performing photolithography and etching thereon. Thereafter, the green color filter 124G is formed on the organic protection film 118 in the G sub-pixel region by coating a green color resist colored with green (G) thereon and performing photolithography and etching thereon. Next, the blue color filter 124B is formed on the organic protection film 118 in the B sub-pixel region by coating a blue color resist colored with blue (B) thereon and performing photolithography and etching thereon. Accordingly, the R, G and B color filters 124R, 124G and 124B are respectively formed in the R, G and B sub-pixel regions.

Figure 7C:
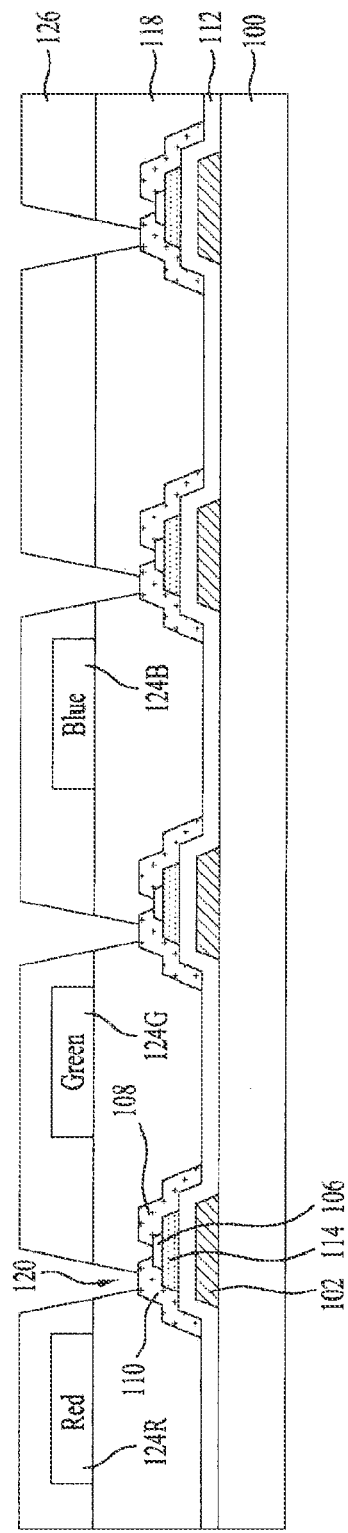

Referring to FIG. 7C, the overcoat layer 126 having pixel contact holes 120 is formed on the substrate 100 with the R, G and B color filters 124R, 124G and 124B formed thereon.

In particular, the overcoat 126 is formed by forming a photosensitive organic film formed of an acryl-based resin on the substrate 100 with the R, G and B color filters 124R, 124G and 124B formed thereon. Subsequently, the pixel contact holes 120 are formed by patterning the organic protection film 118 and the overcoat layer 126 by photolithography and etching. The pixel contact holes 120 expose the drain electrode 110 of the driving thin film transistor of the corresponding sub-pixel region.

Figure 7D:
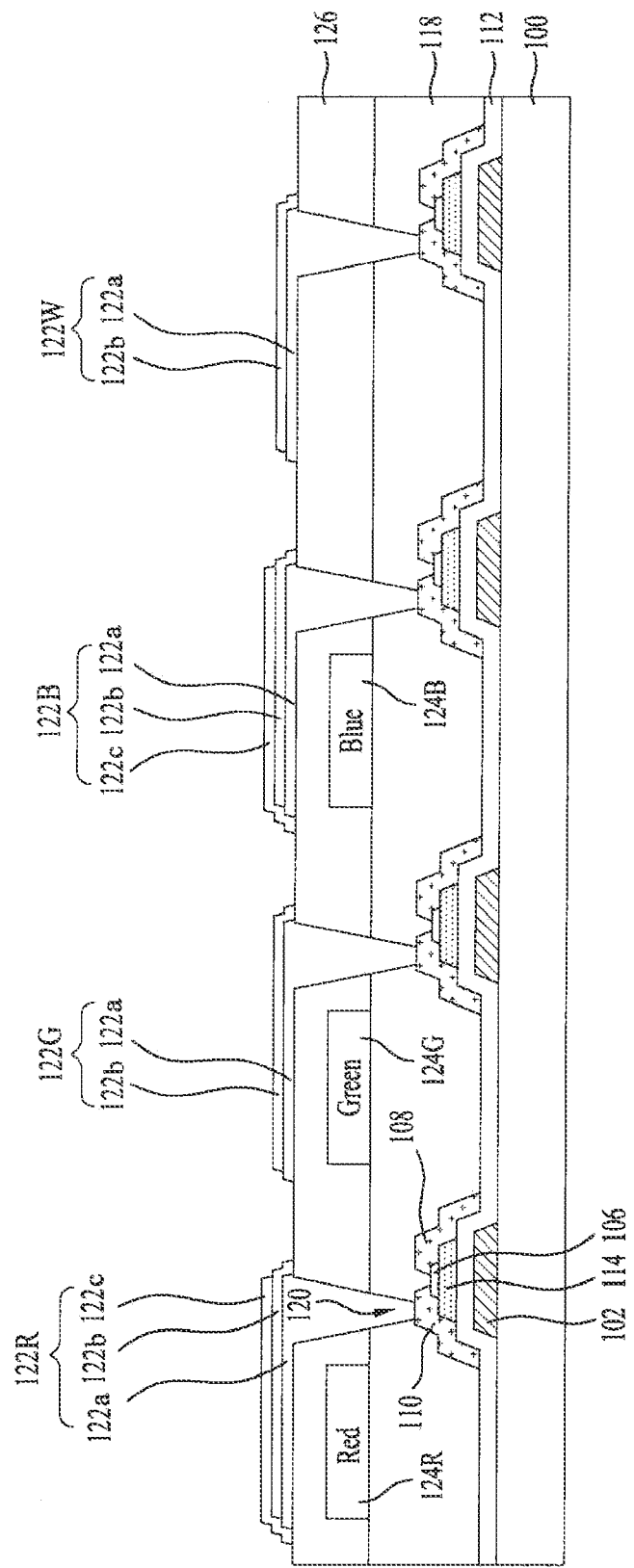

Referring to FIG. 7D, the first electrodes 122R, 122G, 122B and 122W are respectively formed in the R, G, B and W sub-pixel regions on the substrate 100 with the pixel contact holes 120 formed thereon.

Figure 8A:
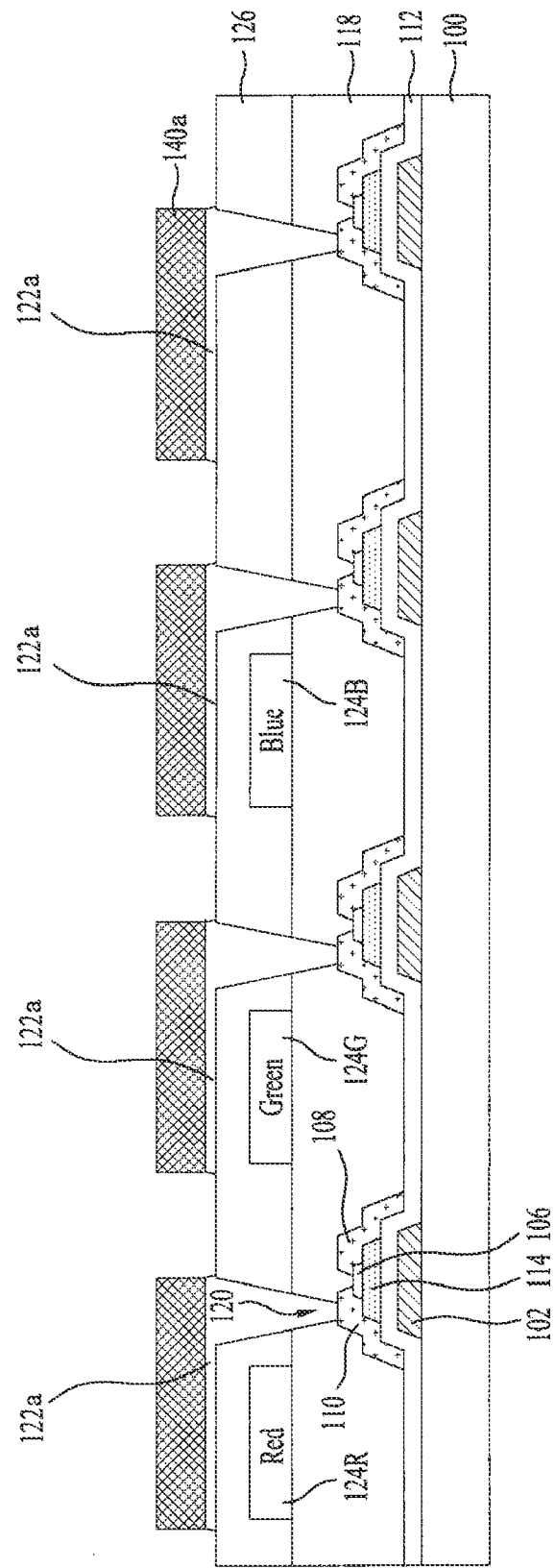
FIGS. 8A to 8C are sectional views for explaining fabrication of a first electrode illustrated in FIG. 7D.

In particular, a first transparent conductive material such as ITO, IZO, or the like is formed on the substrate 100 with the pixel contact holes 120 formed thereon through deposition such as sputtering or the like. Subsequently, as illustrated in FIG. 8A, the first transparent conductive layers 122a are respectively formed in the R, G, B and W sub-pixel regions by etching the first transparent conductive material using, as a mask, first photoresist patterns 140a formed through light exposure and developing processes using a first photo mask.

Figure 8B:
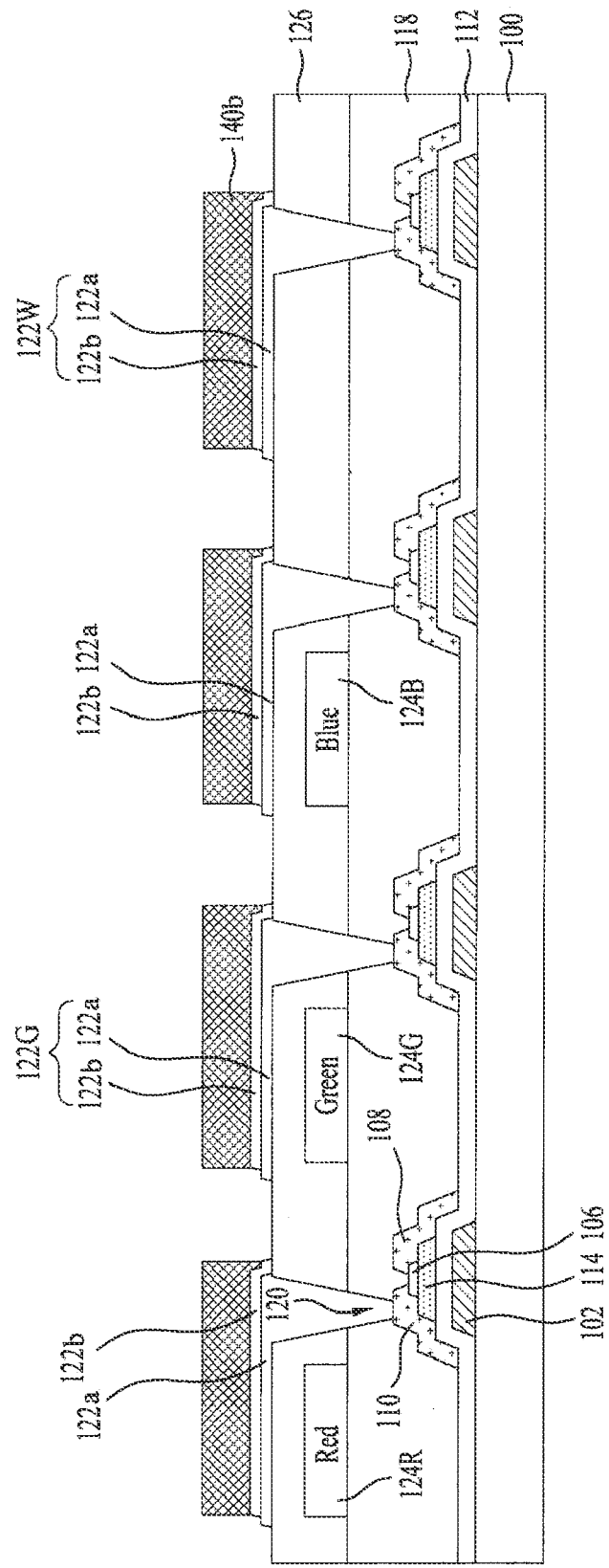

Next, a second transparent conductive material such as ITO, IZO, or the like is formed on the substrate 100 with the first transparent conductive layer 122a formed thereon through deposition such as sputtering or the like. In this regard, the second transparent conductive material is the same or different as the first transparent conductive material. Subsequently, as illustrated in FIG. 8B, the second transparent conductive layers 122b are respectively formed in the R, G, B and W sub-pixel regions by etching the second transparent conductive material using, as a mask, second photoresist patterns 140b formed through light exposure and developing processes using a photo mask. Accordingly, the first electrodes 122G and 122W, each of which includes the first and second transparent conductive layers 122a and 122b, are respectively formed in the G and W sub-pixel regions. Meanwhile, when misalignment occurs within an error range or a photo mask is shifted to one side in alignment of the photo mask on the second transparent conductive material, as illustrated in FIG. 8B, the second transparent conductive layer 122b is formed so as to cover a side of the first transparent conductive layer 122a.

Figure 8C:
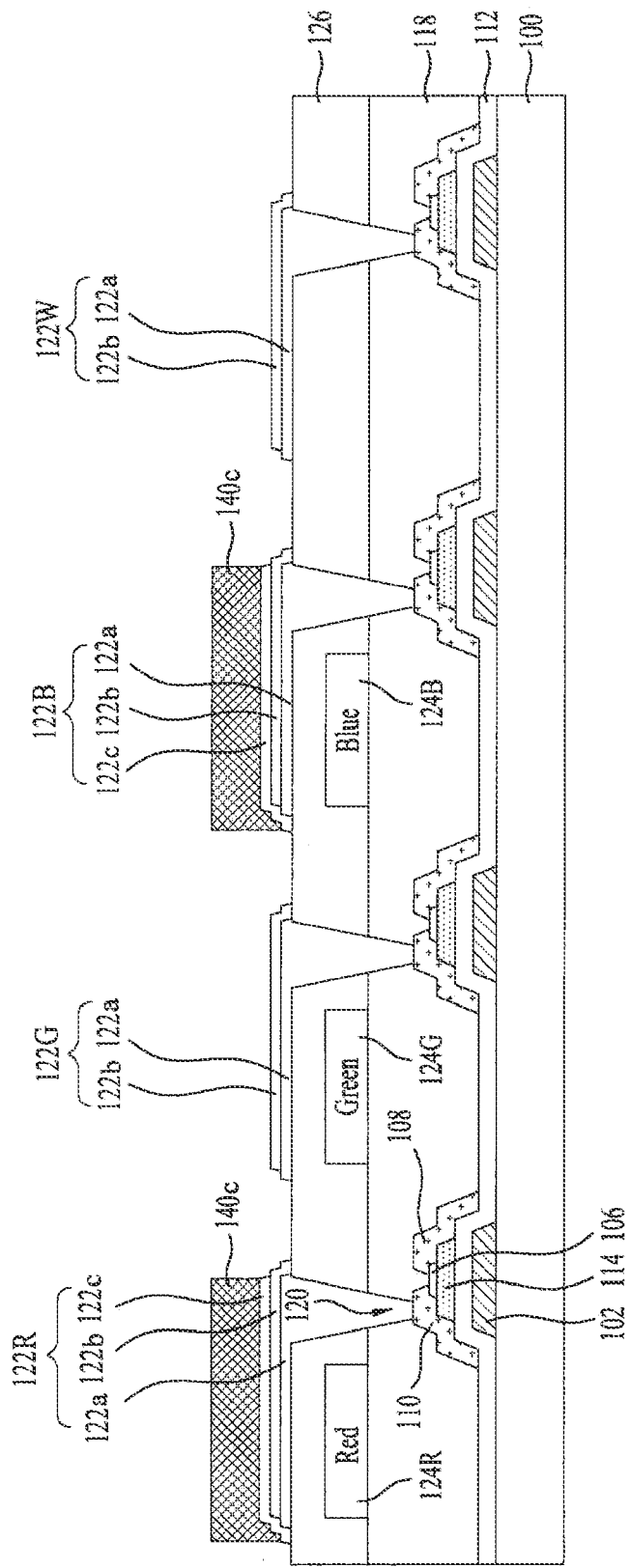

Thereafter, a third transparent conductive material such as ITO, IZO, or the like is formed on the substrate 100 with the second transparent conductive layer 122b formed thereon through deposition such as sputtering or the like. In this regard, the third transparent conductive material is the same or different as at least one of the first and second transparent conductive materials. Subsequently, as illustrated in FIG. 8C, the third transparent conductive layers 122c are respectively formed in the R and B sub-pixel regions by etching the third transparent conductive material using, as a mask, third photoresist patterns 140c formed through light exposure and developing processes using a photo mask. Accordingly, the first electrodes 122R and 122B, each of which includes the first, second and third transparent conductive layers 122a, 122b and 122c, are respectively formed in the R and B sub-pixel regions. As such, in the present invention, the first electrode 122 having a thickness of up to 1500 Å is etched twice or more instead of etching the first electrode 122 at once and thus etching time may be reduced, which results in enhanced efficiency of manufacturing processes.

Referring to FIG. 7E, the bank insulating film 130 having bank holes 132 is formed on the substrate 100 with the first electrode 122 formed thereon.

In particular, the bank insulating film 130 is formed by coating an organic insulating material such as photoacryl on an entire upper surface of the substrate 100 with the first electrode 122 formed thereon. Subsequently, the bank insulating film 130 is patterned by photolithography and etching to form the bank insulating film 130 having bank holes 132 through which the first electrodes 122 are exposed.

Referring to FIG. 7F, the organic common layer 134 is formed on the substrate 100 with the bank insulating film 130 formed thereon, and the second electrode 136 is formed on the organic common layer 134.

In particular, the organic common layer 134 having the stacked structure illustrated in FIG. 3 is formed on the first electrode 122. Thereafter, the second electrode 136 is formed by depositing Al or Ag on the organic common layer 134.

Figure 9:
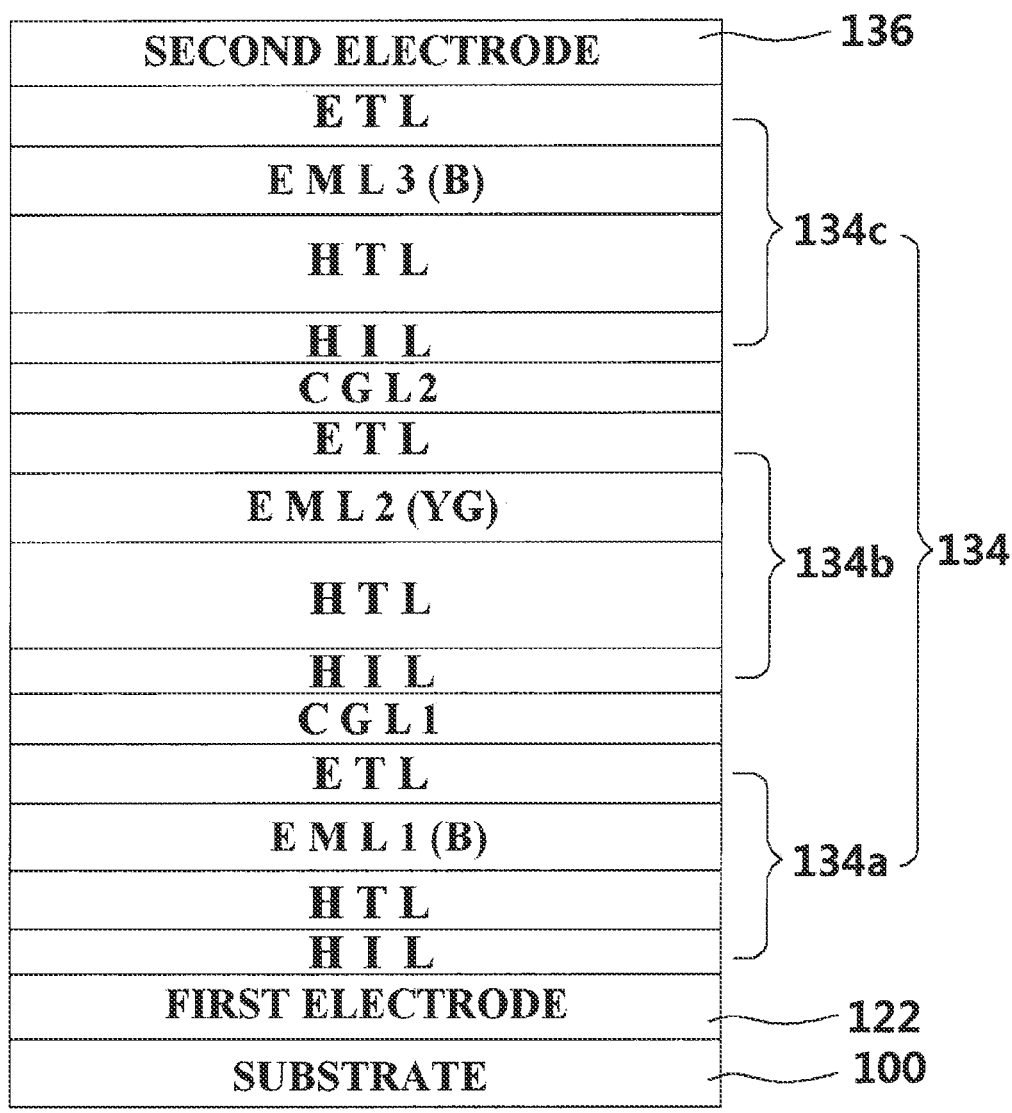
FIG. 9 is a sectional view of an organic light emitting display device according to a second embodiment of the present invention.

FIG. 9 is a sectional view of an organic light emitting display device according to a second embodiment of the present invention.

The organic light emitting display device of FIG. 9 includes the same elements as those of the organic light emitting display device of FIG. 1, except that the organic light emitting display device of FIG. 9 includes three light emitting units. Thus, a detailed description of the same elements will be omitted herein.

The organic common layer 134 of FIG. 9 includes first, second and third light emitting units 134a, 134b and 134c formed between the first and second electrodes 122 and 136, a first charge generation layer CGL1 formed between the first and second light emitting units 134a and 134b, and a second charge generation layer CGL2 formed between the second and third light emitting units 134b and 134c.

Each of the first, second and third light emitting units 134a, 134b and 134c includes a hole injection layer (HIL), a hole transport layer (HTL), an emission layer (EML), and an electron transport layer (ETL). In particular, a first EML EML1 of the first light emitting unit 134a includes a fluorescent blue dopant and host to emit blue light, a second EML EML2 of the second light emitting unit 134b includes a phosphorescent yellow-green dopant and host to emit yellow-green light, and a third EML EML3 of the third light emitting unit 134c includes a fluorescent blue dopant and host to emit blue light. Accordingly, the organic common layer 134 may realize white light through mixing among the blue light emitted from the first light emitting unit 134a, the yellow-green light emitted from the second light emitting unit 134b, and the blue light emitted from the third light emitting unit 134c. In addition, the organic common layer 134 may realize white light using other fluorescent and phosphorescent dopants.

Figure 10A:
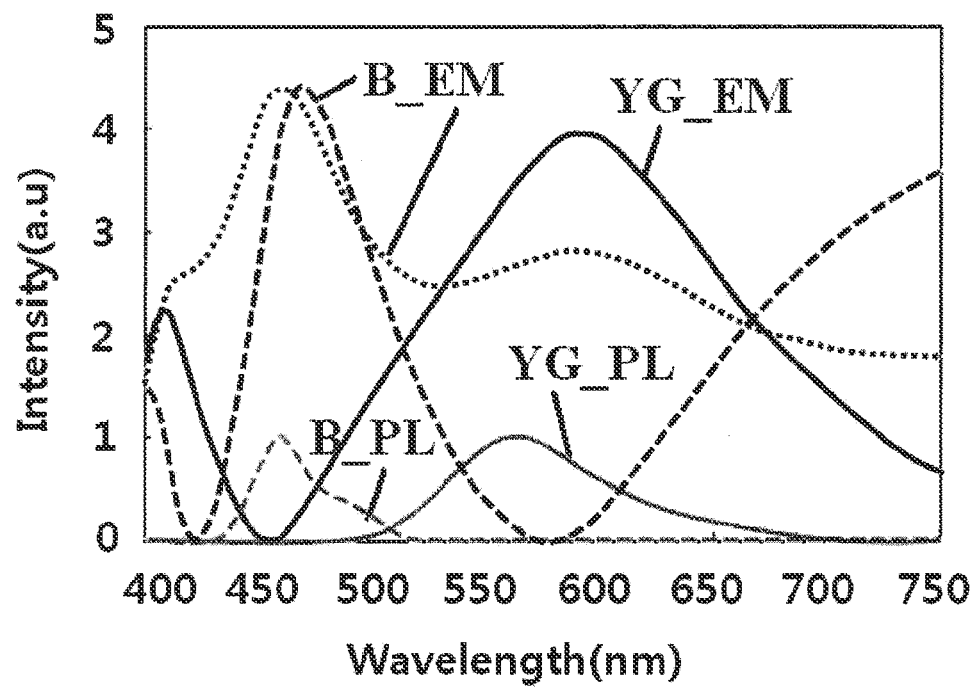
FIGS. 10A to 10C are graphs showing luminescence spectra of comparative examples 3 and 4 and example 2.
Figure 10B:
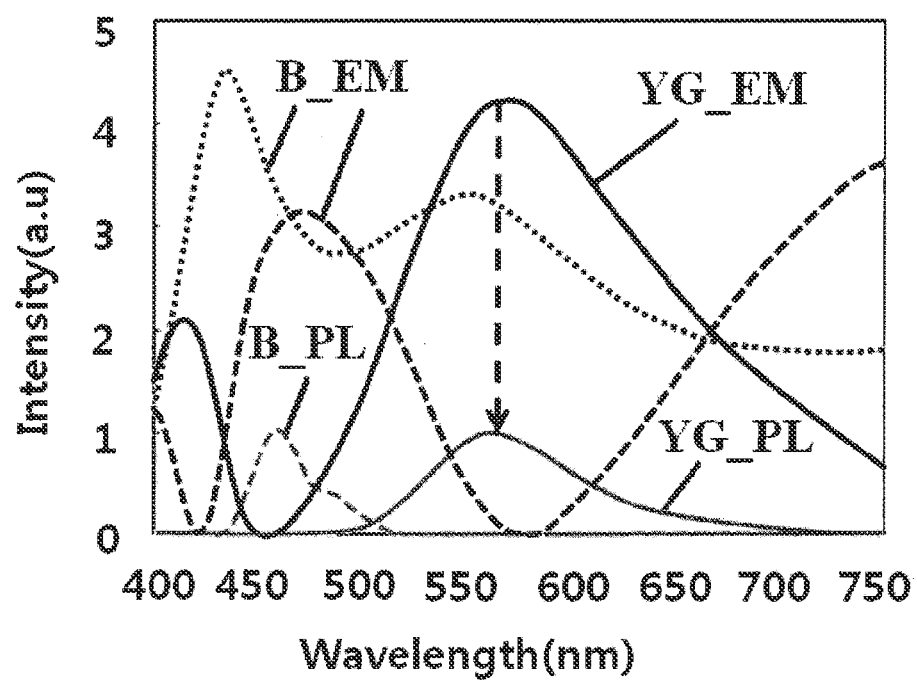
Figure 10C:
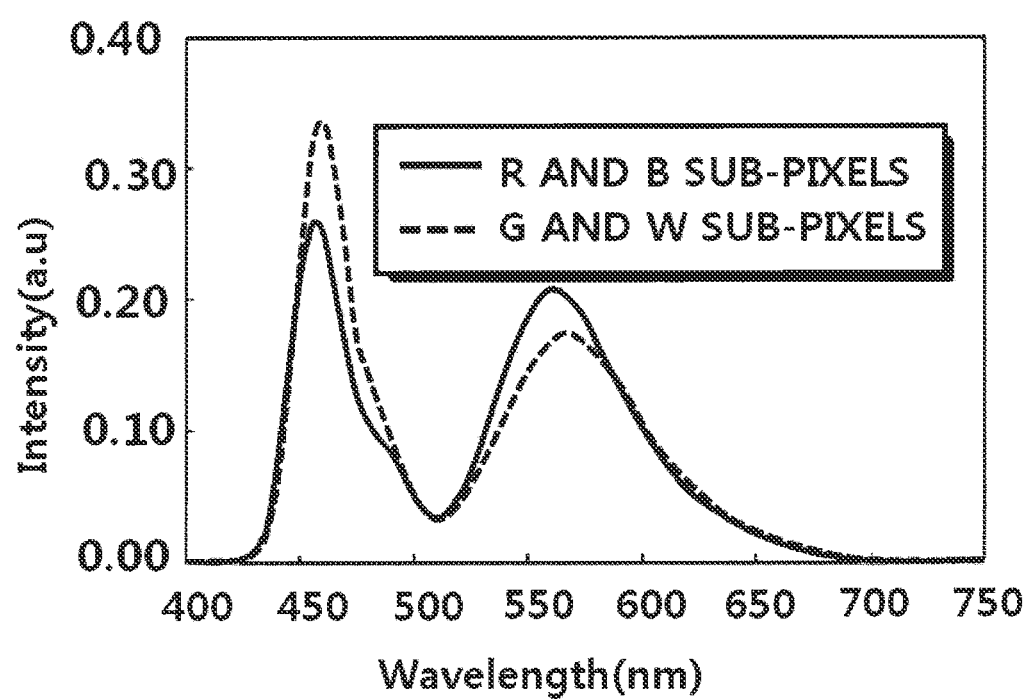

FIGS. 10A to 10C are graphs showing luminescence spectra according to thickness of a first electrode of organic light emitting display devices of comparative examples 3 and 4 and example 2.

In FIGS. 10A to 10C and Table 3 below, the organic light emitting display device of comparative example 3 includes a first electrode formed in R, G, B and W sub-pixel regions and having a first thickness, the organic light emitting display device of comparative example 4 includes a first electrode formed in R, G, B and W sub-pixel regions and having a second thickness that is greater than the first thickness, and the organic light emitting display device of example 2 includes a first electrode formed in each of the R and B sub-pixel regions and having a second thickness and a first electrode formed in each of the G and W sub-pixel regions and having a first thickness. In the organic light emitting display devices of comparative examples 3 and 4 and example 2, a light emitting cell of each sub-pixel region includes the first, second and third EMLs EML1, EML2 and EML3 as illustrated in FIG. 9.

TABLE 3

|  | Efficiency of electroluminescence peak (Cd/A) | | | | Color viewing angle | Panel efficiency |
| --- | --- | --- | --- | --- | --- | --- |
|  | R | G | B | W | (Δu'v') | (cd/A) |
| Comparative Example 3 | 5.4 | 32.5 | 3.3 | 90.7 | 0.020 | 32.5 |
| Comparative Example 4 | 6.0 | 26.9 | 3.9 | 81.3 | 0.043 | 27.4 |
| Example 2 | 6.0 | 32.5 | 3.9 | 90.7 | 0.020 | 32.5 |

The organic light emitting display device of comparative example 3 illustrated in FIG. 10A has wider full width at half maximum (FWHM) of the EM peak wavelength of yellow-green light and wider FWHM of the EM peak wavelength of blue light than an FWHM of the EM peak wavelength of yellow-green light and an FWHM of the EM peak wavelength of blue light, respectively, of the organic light emitting display device of comparative example 4 illustrated in FIG. 10B. Thus, as shown in Table 3, it can be confirmed that the organic light emitting display device of comparative example 4 including the first electrode having a second thickness has deteriorated color viewing angle characteristics when compared to the organic light emitting display device of comparative example 3 including the first electrode having a first thickness.

In addition, an intensity of the EM peak of each of blue light and yellow-green light of the organic light emitting display device of comparative example 3 illustrated in FIG. 10A is lower than that of the EM peak of each of blue light and yellow-green light of the organic light emitting display device of comparative example 4 illustrated in FIG. 10B. Accordingly, as shown in Table 3, it can be confirmed that the organic light emitting display device of comparative example 3 including the first electrode having a first thickness has deteriorated panel efficiency characteristics when compared to the organic light emitting display device of comparative example 4 including the first electrode having a second thickness. In particular, as shown in Table 3, it can be confirmed that efficiency of R and B sub-pixels of the organic light emitting display device of comparative example 3 including the first electrode having a first thickness is lower than that of R and B sub-pixels of the organic light emitting display device of Comparative Example 4 including the first electrode having a second thickness.

By contrast, in example 2, as illustrated in FIG. 10C, EM peak wavelength of white light emitted from the G and W sub-pixel regions respectively including the first electrodes 122G and 122W having a first thickness has a similar phase to that of EM peak wavelength of white light emitted from the R and B sub-pixel regions respectively including the first electrodes 122R and 122B having a second thickness. Accordingly, as shown in Table 3, the organic light emitting display device of example 2 may exhibit the same panel efficiency as that of the organic light emitting display device of comparative example 3, which is higher than the panel efficiency of the organic light emitting display device of comparative example 4 and exhibit the same color viewing angle as that of the organic light emitting display device of comparative example 3, which is wider than the color viewing angle of the organic light emitting display device of comparative example 4. In particular, the organic light emitting display device of example 2 further includes the third light emitting unit 134c to emit blue light when compared to the organic light emitting display device of example 1 and thus has higher intensity of the EL peak of blue light than that in example 1, which results in enhanced blue light efficiency.

As such, as illustrated in FIG. 10C, the organic light emitting display device according to the second embodiment of the present invention emits blue light having a wavelength of 450 nm to 480 nm and yellow-green light having a wavelength of 540 nm to 570 nm and thus may emit light with two peaks.

Figure 11:
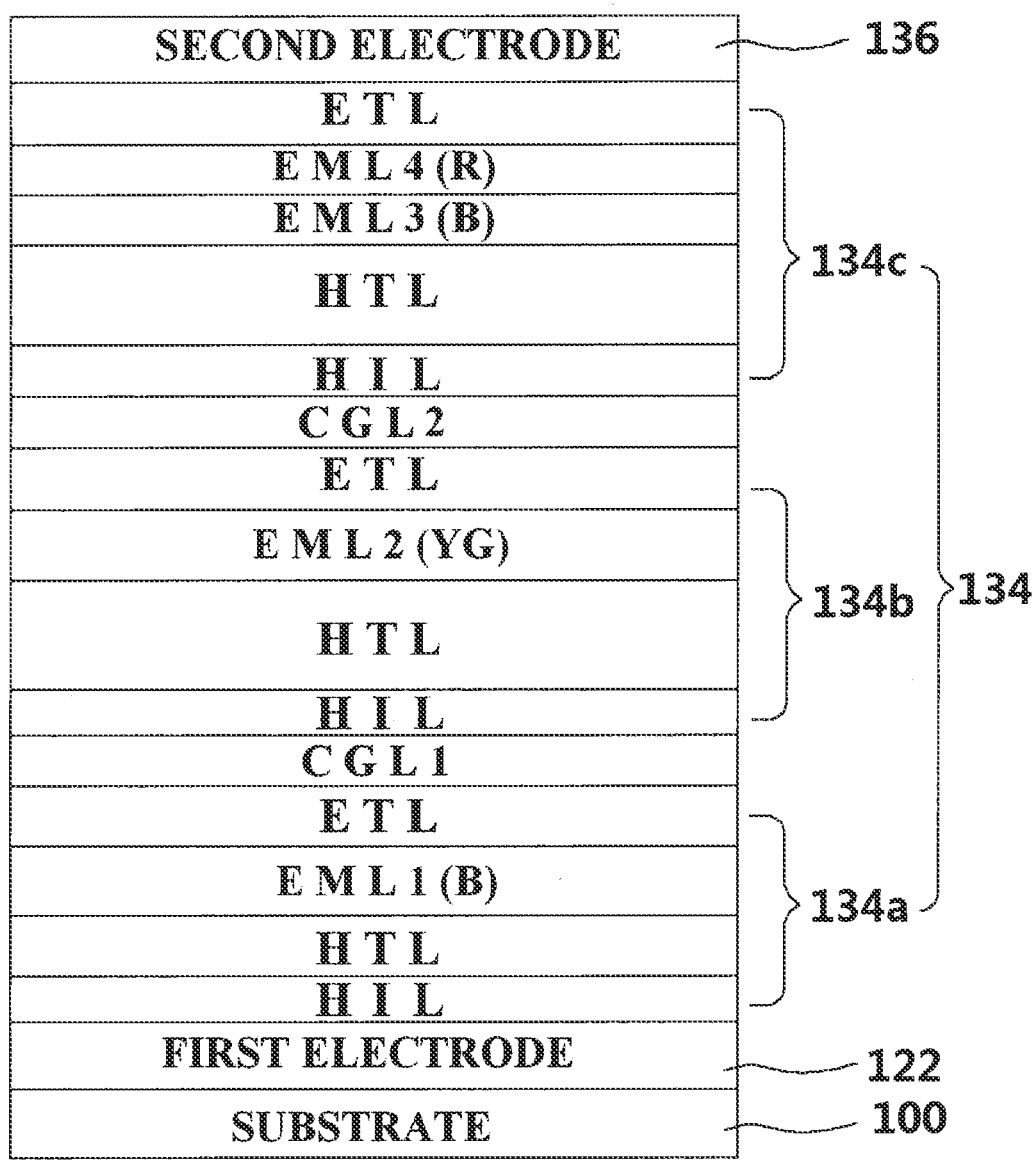
FIG. 11 is a sectional view of an organic light emitting display device according to a third embodiment of the present invention.

FIG. 11 is a sectional view of an organic light emitting display device according to a third embodiment of the present invention.

The organic light emitting display device of FIG. 11 includes the same elements as those of the organic light emitting display device of FIG. 1, except that the organic light emitting display device of FIG. 11 includes three light emitting units. Thus, a detailed description of the same elements will be omitted herein.

The organic common layer 134 of FIG. 11 includes the first, second and third light emitting units 134a, 134b and 134c formed between the first and second electrodes 122 and 136, the first charge generation layer CGL1 formed between the first and second light emitting units 134a and 134b, and the second charge generation layer CGL2 formed between the second and third light emitting units 134b and 134c.

Each of the first, second and third light emitting units 134a, 134b and 134c includes an HIL, an HTL, an EML, and an ETL. In particular, the first EML EML1 of the first light emitting unit 134a includes a fluorescent blue dopant and host to emit blue light, the second EML EML2 of the second light emitting unit 134b includes a phosphorescent yellow-green dopant and host to emit yellow-green light, the third EML EML3 of the third light emitting unit 134c includes a phosphorescent or fluorescent blue dopant and host to emit blue light, and a fourth EML EML4 of the third light emitting unit 134c includes a fluorescent or phosphorescent red dopant and host to emit red light. Accordingly, the organic common layer 134 may realize white light through mixing among the blue light emitted from the first light emitting unit 134a, the yellow-green light emitted from the second light emitting unit 134b, and the red-blue light emitted from the third light emitting unit 134c. In addition, the organic common layer 134 may realize white light using other fluorescent and phosphorescent dopants. As such, the organic light emitting display device according to the third embodiment of the present invention includes the fourth EML EML4 to emit red light and thus has enhanced color reproducibility.

Figure 12A:
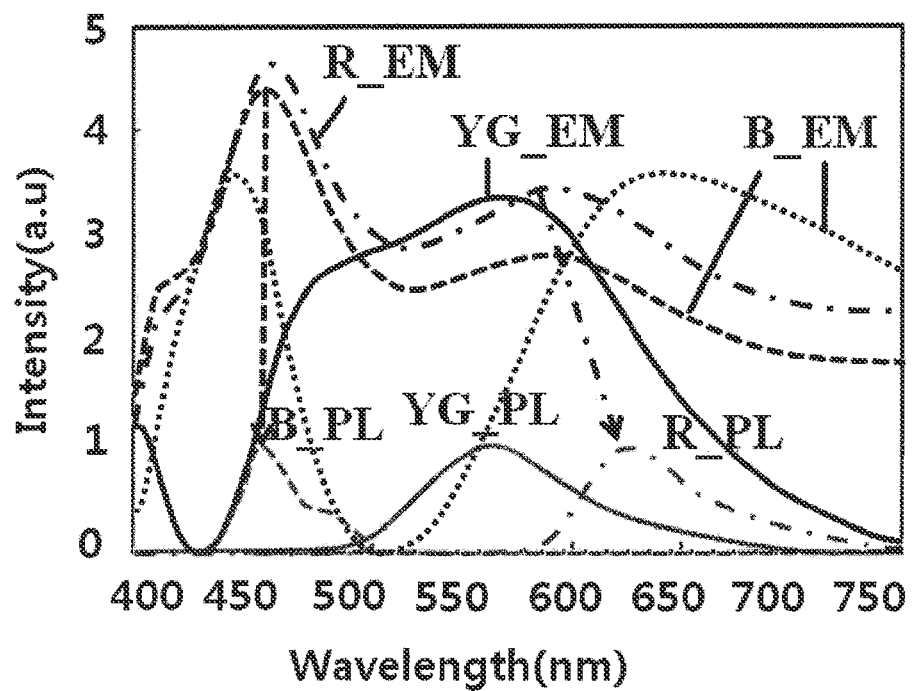
FIGS. 12A to 12C are graphs showing luminescence spectra of comparative examples 5 and 6 and example 3.
Figure 12B:
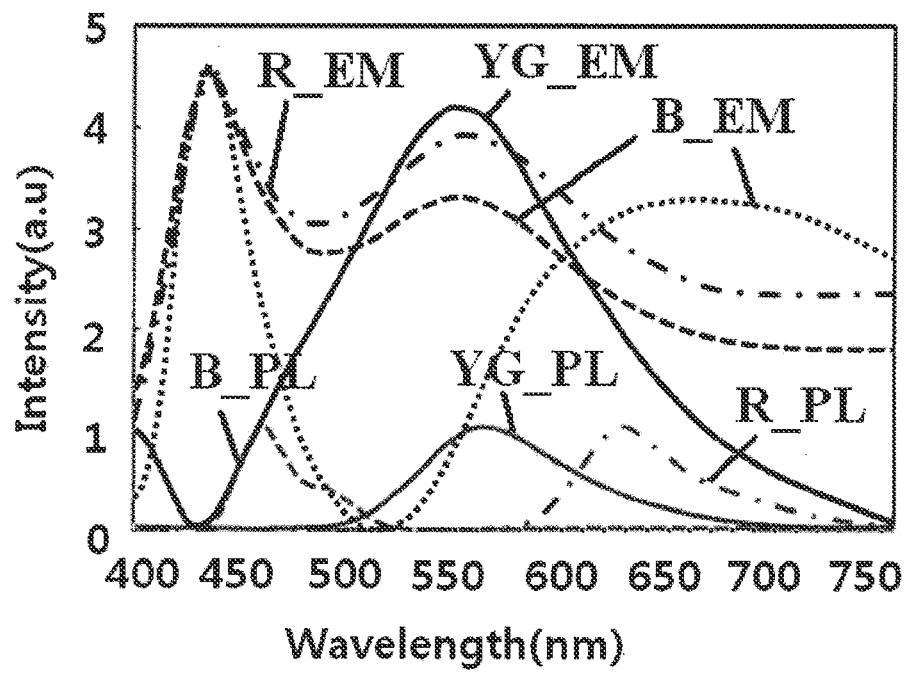
Figure 12C:
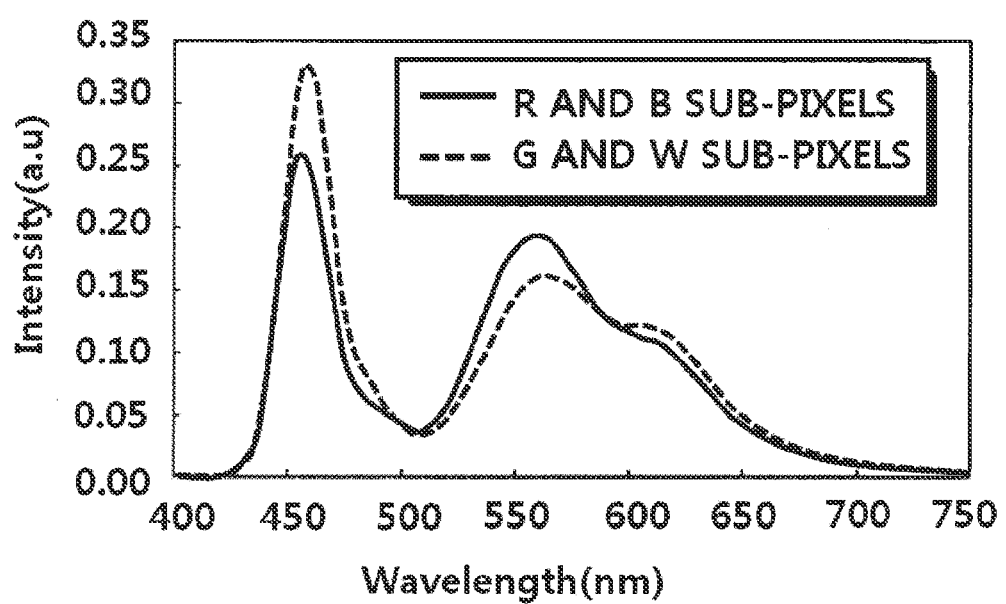

FIGS. 12A to 12C are graphs showing luminescence spectra according to thickness of a first electrode of organic light emitting display devices of comparative examples 5 and 6 and example 3.

In FIGS. 12A to 12C and Table 4 below, the organic light emitting display device of comparative example 5 includes a first electrode formed in R, G, B and W sub-pixel regions and having a first thickness, the organic light emitting display device of comparative example 6 includes a first electrode formed in R, G, B and W sub-pixel regions and having a second thickness that is greater than the first thickness, and the organic light emitting display device of example 3 includes a first electrode formed in each of the R and B sub-pixel regions and having a second thickness and a first electrode formed in each of the G and W sub-pixel regions and having a first thickness. In the organic light emitting display devices of comparative examples 5 and 6 and example 3, a light emitting cell of each sub-pixel region includes the first, second, third and fourth EMLs EML1, EML2, EML3 and EML4 as illustrated in FIG. 11.

TABLE 4

|  | Efficiency of electroluminescence peak (Cd/A) | | | | Color viewing angle | Panel efficiency |
|---|---|---|---|---|---|---|
|  | R | G | B | W | (Δu'v') | (cd/A) |
| Comparative Example 5 | 7.9 | 30.8 | 2.8 | 88 | 0.020 | 31.9 |
| Comparative Example 6 | 8.6 | 25.4 | 3.3 | 79.3 | 0.042 | 33.2 |
| Example 3 | 8.6 | 30.8 | 3.3 | 88 | 0.020 | 33.2 |

The organic light emitting display device of comparative example 5 illustrated in FIG. 12A has wider full width at half maximum (FWHM) of the EM peak wavelength of yellow-green light and wider FWHM of the EM peak wavelength of blue light than an FWHM of the EM peak wavelength of yellow-green light and an FWHM of the EM peak wavelength of blue light, respectively, of the organic light emitting display device of comparative example 6 illustrated in FIG. 12B. Thus, as shown in Table 4, it can be confirmed that the organic light emitting display device of comparative example 6 including the first electrode having a second thickness has deteriorated color viewing angle characteristics when compared to the organic light emitting display device of comparative example 5 including the first electrode having a first thickness.

In addition, an intensity of the EM peak of each of blue light and yellow-green light of the organic light emitting display device of comparative example 5 illustrated in FIG. 12A is lower than that of the EM peak of each of blue light and yellow-green light of the organic light emitting display device of comparative example 6 illustrated in FIG. 12B. Accordingly, as shown in Table 4, it can be confirmed that the organic light emitting display device of comparative example 5 including the first electrode having a first thickness has deteriorated panel efficiency characteristics when compared to the organic light emitting display device of comparative example 6 including the first electrode having a second thickness. In particular, as shown in Table 4, it can be confirmed that efficiency of R and B sub-pixels of the organic light emitting display device of comparative example 5 including the first electrode having a first thickness is lower than that of R and B sub-pixels of the organic light emitting display device of comparative example 6 including the first electrode having a second thickness.

By contrast, in example 3, as illustrated in FIG. 12C, EM peak wavelength of white light emitted from the G and W sub-pixel regions respectively including the first electrodes 122G and 122W having a first thickness has a similar phase to that of EM peak wavelength of white light emitted from the R and B sub-pixel regions respectively including the first electrodes 122R and 122B having a second thickness. Accordingly, as shown in Table 4, the organic light emitting display device of example 3 may exhibit the same panel efficiency as that of the organic light emitting display device of comparative example 6, which is higher than the panel efficiency of the organic light emitting display device of comparative example 5 and exhibit the same color viewing angle as that of the organic light emitting display device of comparative example 5, which is wider than the color viewing angle of the organic light emitting display device of comparative example 6.

As such, as illustrated in FIG. 12C, the organic light emitting display device according to the third embodiment of the present invention emits blue light having a wavelength of 450 nm to 480 nm, yellow-green light having a wavelength of 540 nm to 570 nm, and red light having a wavelength of 620 to 640 nm and thus may emit light with three peaks.

The organic light emitting display devices according to the present invention include up to three light emitting units, but embodiments are not limited thereto. That is, four or more light emitting units may be formed.

As is apparent from the foregoing description, according to organic light emitting display devices and methods of manufacturing the same, the thickness of a first electrode of each of the R and B sub-pixels is greater than that of a first electrode of each of the G and W sub-pixels. Accordingly, organic light emitting display devices manufactured using the manufacturing methods may enhanced viewing angle and efficiency.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing an organic light emitting display device, the method comprising:
    forming a first electrode of each of red, green, blue and white sub-pixels on a substrate;
    forming a white organic common layer on the first electrodes; and
    forming a second electrode on the white organic common layer,
    wherein the first electrodes each comprises multiple transparent conductive layers and are formed such that a thickness of the first electrode of each of two sub-pixels among the red, green, blue and white sub-pixels is greater than that of the first electrode of each of the other two sub-pixels, and
    at least two layers excluding the lowermost layer among the multiple transparent conductive layers of the first electrodes are formed to cover opposite sides of the lowermost layer.

2. The method according to claim 1, wherein the thickness of the first electrode of each of the red and blue sub-pixels is greater by about 300 Å to about 500 Å than that of the first electrode of each of the green and white sub-pixels.

3. The method according to claim 2, wherein the first electrode of the red sub-pixel has the same thickness as that of the first electrode of the blue sub-pixel, and the first electrode of the green sub-pixel has the same thickness as that of the first electrode of the white sub-pixel.

4. The method according to claim 3, wherein the first electrode of each of the red and blue sub-pixels has a thickness of 1100 Å to 1500 Å, and the first electrode of each of the green and white sub-pixels has a thickness of 600 Å to 1200 Å.

5. The method according to claim 2, wherein the forming of the first electrode comprises forming a first electrode comprising first, second and third transparent conductive layers in each of the red and blue sub-pixels and forming a first electrode comprising at least one of the first, second and third transparent conductive layers in each of the green and white sub-pixels.

6. The method according to claim 5, wherein the forming of the first electrode comprises:
    forming a first transparent conductive layer in each of the red, green, blue and white sub-pixels using photolithography and etching;
    forming a second transparent conductive layer covering a first side of the first transparent conductive layer in each of the red, green, blue and white sub-pixels using photolithography and etching; and
    forming a third transparent conductive layer covering a second side of each of the first and second transparent conductive layers in each of the red and blue sub-pixels using photolithography and etching.

7. The method according to claim 1, wherein the forming of the white organic common layer comprises:
    forming at least two light emitting units between the first and second electrodes; and
    forming at least one charge generation layer between the at least two light emitting units.

8. The method according to claim 7, wherein the forming of the white organic common layer comprises:
    forming a first light emitting unit comprising a first emission layer to realize blue color on the first electrodes;
    forming a first charge generation layer on the first light emitting unit; and
    forming a second light emitting unit comprising a second emission layer to realize yellow-green color on the first charge generation layer.

9. The method according to claim 8, wherein the forming of the white organic common layer further comprises:
    forming a second charge generation layer on the second light emitting unit; and
    forming a third light emitting unit comprising a third emission layer to realize blue color on the second charge generation layer.

10. The method according to claim 8, wherein the forming of the white organic common layer further comprises:
    forming a second charge generation layer on the second light emitting unit; and
    forming a third light emitting unit comprising a third emission layer to realize red color and a fourth emission layer to realize blue color on the second charge generation layer.

11. An organic light emitting display device comprising:
    first electrodes of each of red, green, blue and white sub-pixels formed on a substrate;
    a second electrode facing the first electrodes; and
    a white organic common layer formed between the first and second electrodes;
    wherein the first electrodes each comprise multiple transparent conductive layers and are formed such that a thickness of the first electrode of each of two sub-pixels among the red, green, blue and white sub-pixels is greater than a thickness of the first electrode of each of the other two sub-pixels, and
    at least two layers excluding the lowermost layer among the multiple transparent conductive layers of each first electrode are formed to cover opposite sides of the lowermost layer.

12. The organic light emitting display device according to claim 11, wherein the thickness of the first electrode of each of the red and blue sub-pixels is greater by about 300 Å to about 500 Å than that of the first electrode of each of the green and white sub-pixels.

13. The organic light emitting display device according to claim 11, wherein the first electrode of the red sub-pixel has the same thickness as that of the first electrode of the blue sub-pixel, and the first electrode of the green sub-pixel has the same thickness as that of the first electrode of the white sub-pixel.

14. The organic light emitting display device according to claim 13, wherein the first electrode of each of the red and blue sub-pixels has a thickness of 1100 Å to 1500 Å, and the first electrode of each of the green and white sub-pixels has a thickness of 600 Å to 1200 Å.

15. The organic light emitting display device according to claim 14, wherein the red and blue sub-pixels, the first electrodes of which have the same thickness, are arranged adjacent to each other, and the green and white sub-pixels, the first electrodes of which have the same thickness, are arranged adjacent to each other.

16. The organic light emitting display device according to claim 12, wherein the first electrode of each of the red and blue sub-pixels comprises:

a first transparent conductive layer formed on the substrate;

a second transparent conductive layer formed so as to cover a first side of the first transparent conductive layer; and a third transparent conductive layer formed so as to cover a second side of each of the first and second transparent conductive layers, and the first electrode of each of the green and white sub-pixel regions comprises at least one of the first, second and third transparent conductive layers.

17. The organic light emitting display device according to claim 11, wherein the white organic common layer comprises:

at least two light emitting units formed between the first and second electrodes; and at least one charge generation layer formed between the at least two light emitting units.

18. The organic light emitting display device according to claim 17, wherein the white organic common layer comprises:

a first light emitting unit formed on the first electrode and comprising a first emission layer to realize blue color;

a first charge generation layer formed on the first light emitting unit; and a second light emitting unit formed on the first charge generation layer and comprising a second emission layer to realize yellow-green color.

19. The organic light emitting display device according to claim 18, wherein the white organic common layer further comprises:

a second charge generation layer formed on the second light emitting unit; and a third light emitting unit formed on the second charge generation layer and comprising a third emission layer to realize blue color.

20. The organic light emitting display device according to claim 18, wherein the white organic common layer further comprises:

a second charge generation layer formed on the second light emitting unit; and a third light emitting unit formed on the second charge generation layer and comprising a third emission layer to realize red color and a fourth emission layer to realize blue color.

* * * * *